(12) United States Patent
Yagishita et al.

(10) Patent No.: US 6,887,747 B2
(45) Date of Patent: May 3, 2005

(54) METHOD OF FORMING A MISFET HAVING A SCHOTTKY JUNCTIONED SILICIDE

(75) Inventors: Atsushi Yagishita, Yokohama (JP); Kouji Matsuo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 10/205,203

(22) Filed: Jul. 26, 2002

(65) Prior Publication Data

US 2002/0179980 A1 Dec. 5, 2002

Related U.S. Application Data

(62) Division of application No. 09/901,721, filed on Jul. 11, 2001, now abandoned.

(30) Foreign Application Priority Data

Jul. 11, 2000 (JP) ........................ 2000-210473
Jun. 8, 2001 (JP) ........................ 2001-174567

(51) Int. Cl.[7] .................... H01L 21/336; H01L 21/8234
(52) U.S. Cl. .................. 438/197; 438/199; 438/230; 438/570; 438/571; 438/576; 438/581
(58) Field of Search ............................. 438/197, 199, 438/212, 230, 570, 571, 581

(56) References Cited

U.S. PATENT DOCUMENTS

| | | | |
|---|---|---|---|
| 4,434,013 A | 2/1984 | Bol | 148/1.5 |
| 4,485,550 A | 12/1984 | Koeneke et al. | 29/571 |
| 4,586,063 A | 4/1986 | Nakamura et al. | 357/22 |
| 4,769,686 A | 9/1988 | Horiuchi et al. | |
| 4,783,688 A | 11/1988 | Shannon | 357/15 |
| 5,159,416 A | 10/1992 | Kudoh | 357/23.7 |
| 5,512,502 A | 4/1996 | Ootsuka et al. | 437/41 |
| 6,081,007 A | 6/2000 | Matsuoka | 257/285 |
| 6,204,539 B1 | 3/2001 | Oyamatsu | 257/382 |
| 6,303,479 B1 | 10/2001 | Snyder | 438/581 |

FOREIGN PATENT DOCUMENTS

| | | | |
|---|---|---|---|
| KR | 1991-0006249 | 12/1984 | |
| WO | WO 86/01641 | * 3/1986 | ........... H01L/29/56 |

OTHER PUBLICATIONS

Atsushi Yagishita, et al., "Semiconductor Device And Method Of Manufacturing The Same", US patent application Ser. No. 09/105,960, Filed: Jun. 29, 1998.

(Continued)

Primary Examiner—HsienMing Lee
(74) Attorney, Agent, or Firm—Finnegan, Henderson, Farabow, Garrett & Dunner, L.L.P.

(57) ABSTRACT

There is disclosed a semiconductor device in which a device isolating insulating film is formed in a periphery of a device region of a semiconductor silicon substrate device region. A side wall insulating film formed of a silicon nitride film is formed to cover the periphery of a channel region on the silicon substrate. A $Ta_2O_5$ film, and a metal gate electrode are formed inside a trench whose side wall is formed of the side wall insulating film. An interlayer insulating film is formed on the device isolating insulating film. A Schottky source/drain formed of silicide is formed on the silicon substrate in a bottom portion of the trench whose side wall is formed of the side wall insulating film and interlayer insulating film. A source/drain electrode is formed on the Schottky source/drain.

7 Claims, 29 Drawing Sheets

OTHER PUBLICATIONS

Jakub Kedzierski et al., "Complementary Silicide Source/ Drain Thin–Body MOSFETs For The 20NM Gate Length Regime", Department of Electrical Engineering and Computer Sciences, University of California, IEDM Tech. Dig., pp. 57–60, Apr. 2000.

S.A. Rishton, New Complimentary Metal–Oxide Semiconductor Technology With Self–Aligned Schottky Source/ Drain And Low–Resistance T Gates, IBM Research Division, J. Vac. Sci. Technology B 15(6), pp. 2795–2798, Nov./Dec. 1997.

A. Chatterjee et al., "Sub–100nm Gate Length Metal Gate NMOS Transistors Fabricated by a Replacement Gate Process", IEDM Tech. Dig., (1997), pp. 821–824.

A. Yagishita et al., "High Performance Metal Gate MOSFETs Fabricated by CMP for $0.1\mu m$ Regime", IEDM Tech. Dig., (1998), pp. 785–788.

B. Cheng et al., "The Impact of High–κ Gate Dielectrics and Metal Gate Electrodes on Sub–100 nm MOSFET's", IEEE Transactions on Electron Devices, Vo. 46, No. 7, Jul. 1999, pp. 1537–1544.

English–language translation of Office Action dated May 17, 2004 from the Korean Patent Office in Korean Application No. 10–2001–0041173.

* cited by examiner

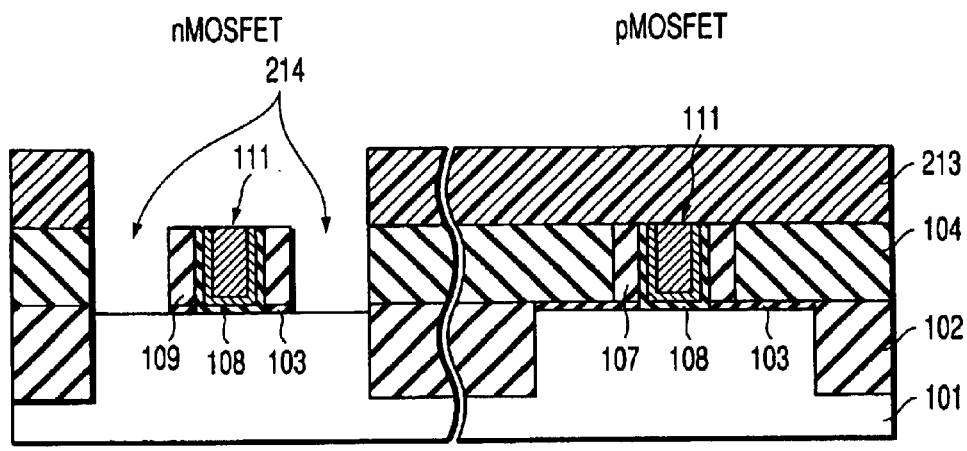
F I G. 4E
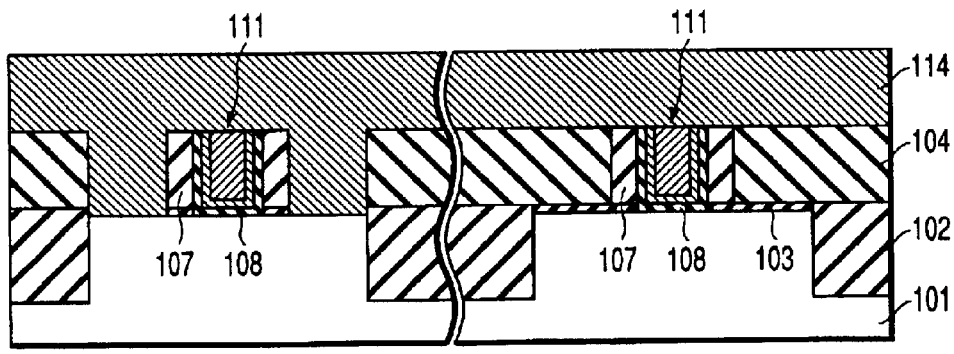
F I G. 4F
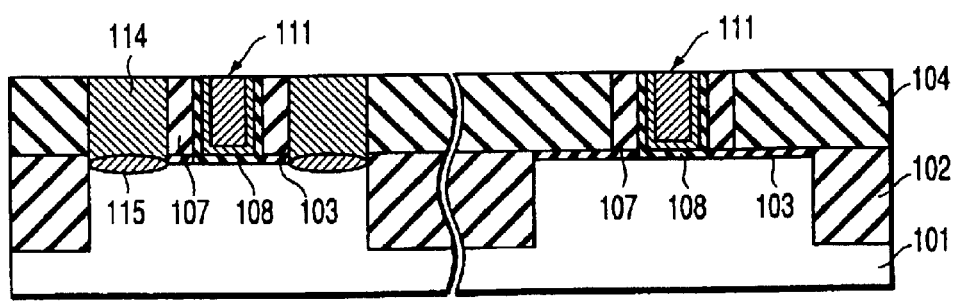
F I G. 4G

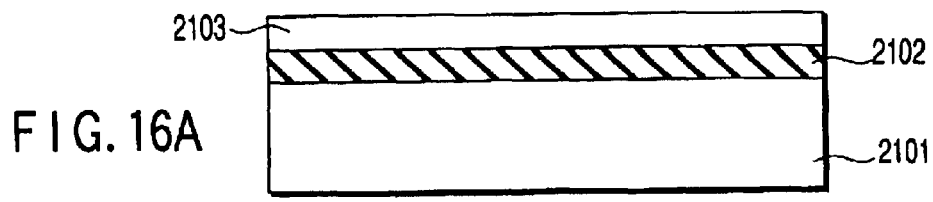
F I G. 16A
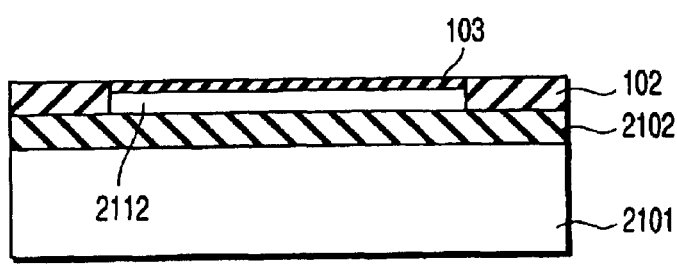
F I G. 16B
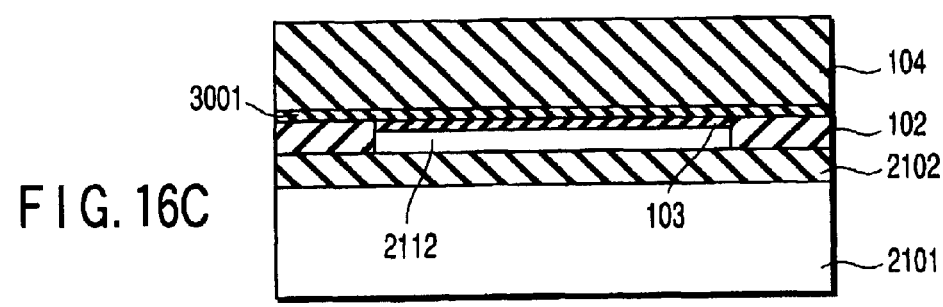
F I G. 16C
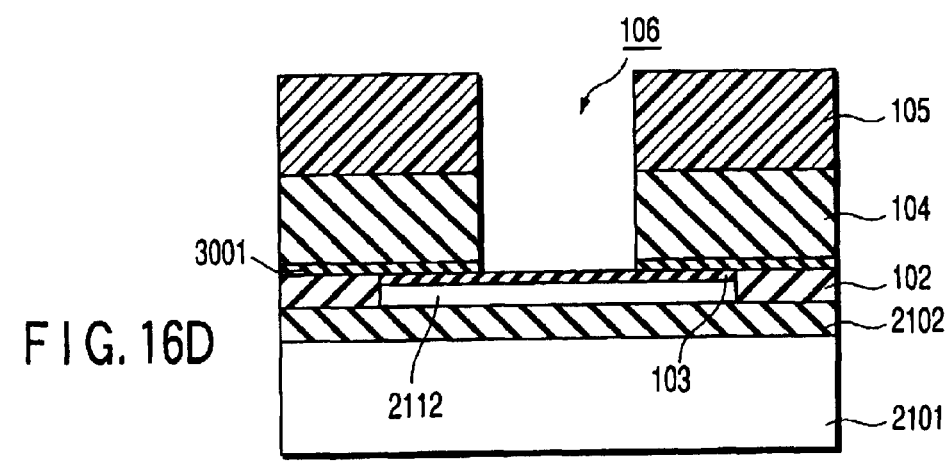
F I G. 16D

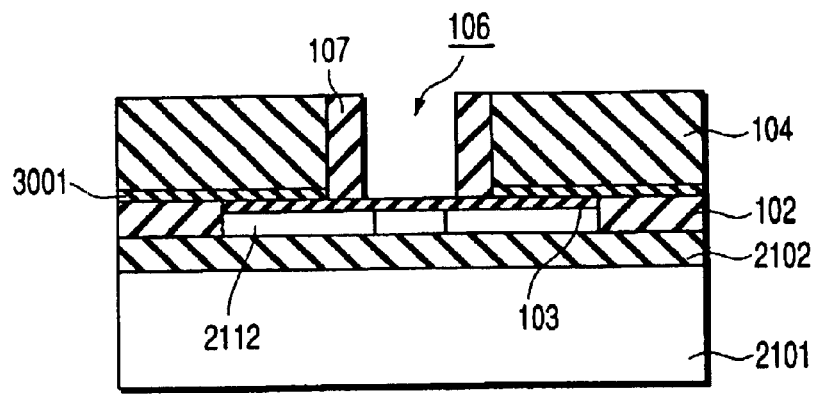
F I G. 16E
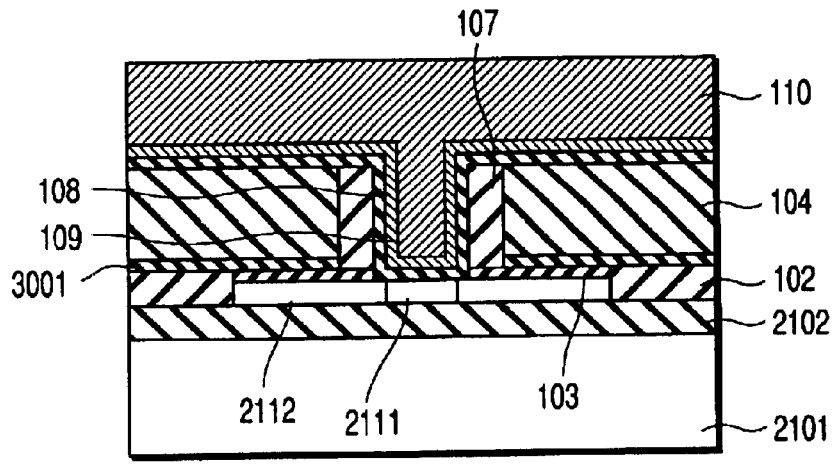
F I G. 16F
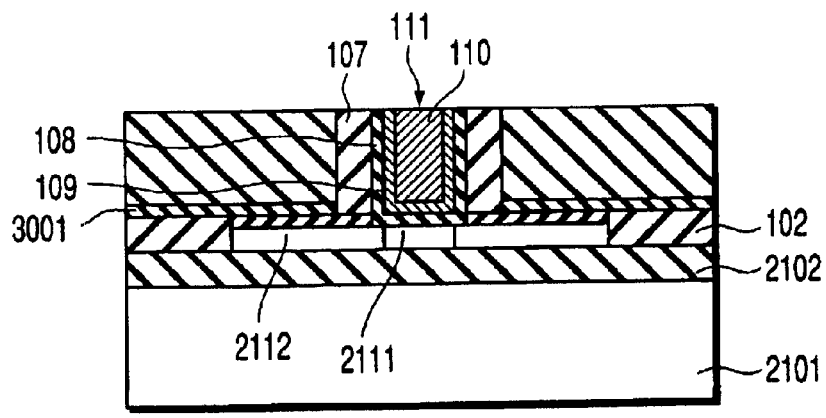
F I G. 16G

METHOD OF FORMING A MISFET HAVING A SCHOTTKY JUNCTIONED SILICIDE

This is a division of application Ser. No. 09/901,721, filed Jul. 11, 2001 which is incorporated in its entirety herein by reference now abandoned.

CROSS-REFERENCE TO RELATED APPLICATIONS

This application is based upon and claims the benefit of priority from the prior Japanese Patent Applications No. 2000-210473, filed Jul. 11, 2000; and No. 2001-174567, filed Jun. 8, 2001, the entire contents of both of which are incorporated herein by reference.

BACKGROUND OF THE INVENTION

1. Field of the Invention

The present invention relates to a semiconductor device including MISFET in which silicide to be Schottky junctioned to a silicon substrate is used in source and drain, and a method for manufacturing the semiconductor device.

2. Description of the Related Art

A process (replacement gate process, damascene gate process) using a dummy gate has been proposed in order to apply a metal gate and highly dielectric gate insulating film to MOSFET (reference documents: A. Chatterjee et al., IEDM Tech. Dig., (1997), p. 821 and A. Yagishita et al., IEDM Tech Dig., (1998), p. 785).

Here, the dummy gate process comprises: forming a disposable gate to be removed later in a region forming a gate in future; forming a source/drain in the region by self-alignment; removing the dummy gate; and using a damascene process in a trench formed by removing the dummy gate to replace the dummy gate with an intrinsic gate.

When the dummy gate process is used, the source/drain requiring a high-temperature thermal treatment is formed before the gate. Therefore, a thermal process after gate formation can be performed at a low temperature of 450° C. or less. Therefore, it is easy to apply a metal gate electrode or a highly dielectric gate insulating film inferior in heat resistance to MISFET.

Problems of a damascene gate (or a replacement gate) transistor using a metal gate and high-k gate insulating film are as follows:

(1) a number of process steps remarkably increases in order to form and remove the dummy gate;

(2) a short channel effect is deteriorated by a fringe (exudation) effect of a gate electric field (reference document: Baohong Cheng et al., IEEE Transactions on ELECTRON DEVICES, Vol. 46, No. 7, (1999), p. 1537); and (3) work functions of many metal gates for use are positioned in the vicinity of a mid gap of silicon, and this influences/increases a threshold voltage (absolute value).

BRIEF SUMMARY OF THE INVENTION (1) According to the present invention, there is provided a semiconductor device comprising: a silicon substrate; a gate insulating film formed on the silicon substrate; a gate electrode formed on the gate insulating film; and a source and a drain formed on the silicon substrate to hold the gate electrode therebetween and formed of a silicide material to be Schottky junctioned to an interface with the silicon substrate. The semiconductor device satisfies at least one of conditions that a material of the gate insulating film is a highly dielectric film and that a material of the gate electrode is a metal.

(2) According to the present invention, there is provided a semiconductor device comprising nMISFET and pMISFET each including a silicon substrate; a gate insulating film formed on the silicon substrate; a gate electrode formed on the gate insulating film; and a source and a drain formed on the silicon substrate to hold the gate electrode therebetween and formed of silicide. The semiconductor device satisfies at least one of conditions that a material of the gate insulating film is a highly dielectric film and that a material of the gate electrode is a metal, and silicide materials constituting the nMISFET and pMISFET differ from each other.

(3) According to the present invention, there is provided a method for manufacturing a semiconductor device comprising the steps of: forming an interlayer insulating film on a silicon substrate; selectively removing the interlayer insulating film between source and drain forming regions of MISFET, and forming a gate trench; forming a side wall insulating film on a side wall of the gate trench; exposing the silicon substrate on a bottom surface of the gate trench, and forming a gate insulating film on the exposed surface of the silicon substrate; burying/forming a gate electrode in the trench; selectively etching the interlayer insulating film of the source and drain forming regions of the MISFET, and forming a source/drain trench with the surface of the silicon substrate exposed in a bottom portion thereof; burying/forming a metal film in the source/drain trench, and forming a source electrode and a drain electrode; and reacting the silicon substrate with the source electrode and the drain electrode, forming a silicide film to be Schottky junctioned to the silicon substrate, and forming a source and a drain.

(4) According to the present invention, there is provided a method for manufacturing a semiconductor device comprising the steps of: forming an interlayer insulating film on a silicon substrate; selectively removing the interlayer insulating film between source and drain forming regions of pMISFET and nMISFET, and forming a gate trench; forming a side wall insulating film on a side wall of the gate trench; exposing the silicon substrate on a bottom surface of the gate trench, and forming a gate insulating film on the exposed surface of the silicon substrate; burying/forming a gate electrode in the gate trench; removing the interlayer insulating film of the source and drain forming regions of the pMISFET, and forming a pMIS-side source/drain trench with the surface of the silicon substrate exposed in a bottom portion thereof; burying/forming a first metal film in the pMIS-side source/drain trench, and forming a source electrode and a drain electrode of the pMISFET; reacting the silicon substrate with the source electrode and the drain electrode of the pMISFET, forming a silicide film to be Schottky junctioned to the silicon substrate, and forming a source and a drain of the pMISFET; removing the interlayer insulating film between source and drain forming regions of the nMISFET, and forming a nMIS-side source/drain trench with the surface of the silicon substrate exposed in a bottom portion thereof; burying/forming a second metal film formed of a material different from the material of the first metal film in the nMIS-side source/drain trench, and forming a source electrode and a drain electrode of the nMISFET; reacting the silicon substrate with the source electrode and the drain electrode of the nMISFET, forming a silicide film to be Schottky junctioned to the silicon substrate, and forming a source and a drain of the nMISFET.

(5) According to the present invention, there is provided a method for manufacturing a semiconductor device comprising the steps of: forming an interlayer insulating film on a silicon substrate; forming a source/drain trench with the surface of the silicon substrate exposed in a bottom portion thereof in the interlayer insulating film of MISFET source and drain forming regions; burying/forming a metal film in the source/drain trench, and forming a source electrode and a drain electrode; reacting the silicon substrate with the source electrode and the drain electrode, forming a silicide film to be Schottky junctioned to the silicon substrate, and forming a source and a drain; forming a gate trench having an exposed side surface via which the source electrode is disposed opposite to the drain electrode; forming a side wall insulating film in a side wall of the gate trench; exposing the silicon substrate on a bottom surface of the gate trench, and forming a gate insulating film on the exposed surface of the silicon substrate; and burying/forming a gate electrode in the gate trench.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 4A to 4J are process sectional views showing a manufacturing process of the CMISFET shown in FIG. 3;

FIGS. 16A to 16I are gate length direction sectional views showing a manufacturing process of the nMISFET according to a twelfth embodiment.

DETAILED DESCRIPTION OF THE INVENTION

Preferred embodiments of the present invention will be described hereinafter with reference to the drawings.

FIRST EMBODIMENT

Figure 1:
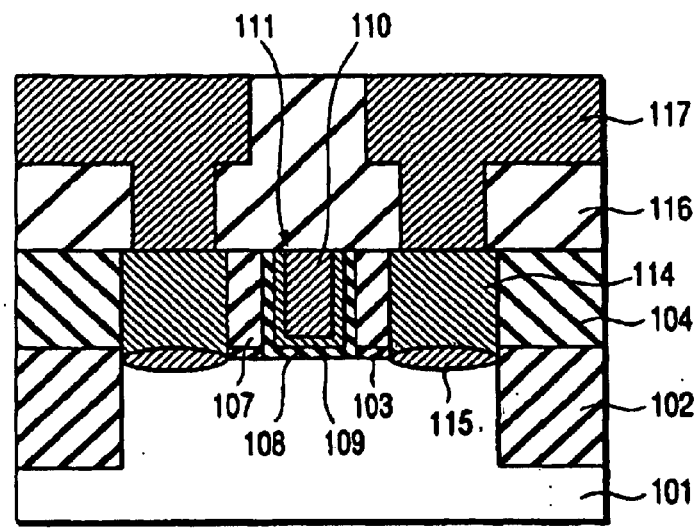
FIG. 1 is a sectional view showing a constitution of nMISFET according to a first embodiment.

FIG. 1 is a sectional view showing a constitution of nMISFET according to a first embodiment of the present invention. Additionally, FIG. 1 shows a section of a gate length direction.

As shown in FIG. 1, a device isolating insulating film 102 is formed in a periphery of a device region of a semiconductor silicon substrate 101. A side wall insulating film 107 of a silicon nitride film is formed on the silicon substrate 101 so that a periphery of a channel region is covered.

Inside a trench whose side wall is formed of the side wall insulating film, a $Ta_2O_5$ film 108, barrier metal TiN film 109, and Al film 110 are buried/formed. The $Ta_2O_5$ film 108 is a gate insulating film, and the barrier metal TiN film 109 and Al film 110 form a metal gate electrode 111.

An interlayer insulating film 104 is formed on the device isolating insulating film 102. A Schottky junctioned source/drain 115 of silicide is formed on the silicon substrate 101 in a bottom portion of the trench whose side wall is formed of the side wall insulating film 107 and interlayer insulating film. A source/drain electrode 114 is formed on the Schottky junctioned source/drain 115.

This nMISFET is a transistor (Schottky barrier tunnel transistor (SBTT)) in which the source and drain junctioned to the silicon substrate not by pn junction but by Schottky junction are used. The SBTT has a small depletion layer width in a junction portion of source and drain regions. Moreover, since a Schottky barrier height does not change by an electric field excluding a mirror image effect, drain-induced barrier lowering (DIBL) can be avoided. Therefore, a short channel effect can be suppressed in this transistor structure. Since the short channel effect is suppressed, a channel density can be decreased, S-factor is therefore improved, and a threshold voltage can effectively be reduced.

A manufacturing method of the nMISFET will next be described with reference to FIGS. 2A to 2L. FIGS. 2A to 2L are process sectional views showing the manufacturing process of the nMISFET shown in FIG. 1.

Figure 2A:
FIGS. 2A to 2L are process sectional views showing a manufacturing process of the nMISFET shown in FIG. 1.
Figure 2B:
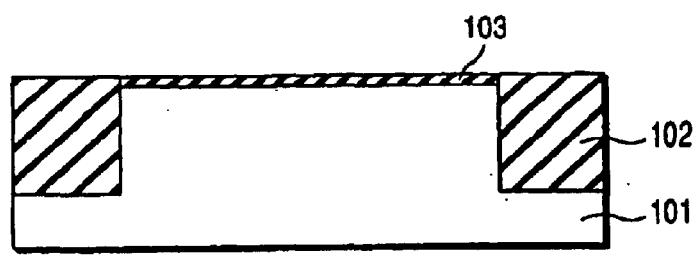

The process will be described in order. First, as shown in FIG. 2A, the semiconductor silicon substrate 101 is prepared. Subsequently, as shown in FIG. 2B, in order to separate the devices by shallow trench isolation (STI), a trench with a depth of about 200 nm is formed in a device isolating region, a TEOS—$SiO_2$ film is buried/formed in the trench and the device isolating insulating film 102 is formed.

Figure 2C:
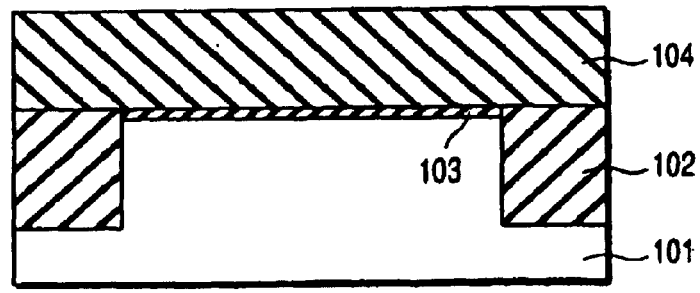

Subsequently, as shown in FIG. 2C, after an $Sio_2$ film 103 is formed on the surface of the silicon substrate 101 by thermal oxidation of about 5 nm, an about 150 nm thick TEOS—$SIO_2$ film is deposited by LPCVD method to form the interlayer insulating film 104. This interlayer insulating film is used as a stopper of CMP later in the process.

Figure 2D:
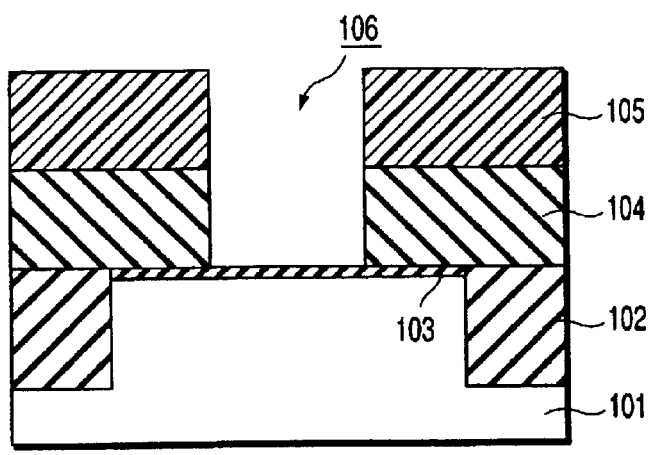

Subsequently, as shown in FIG. 2D, after a resist film 105 having an opening in a MISFET channel forming region is formed by EB direct drawing or lithography, the resist film 105 is used as a mask to etch the interlayer insulating film 104 between source and drain forming regions, and a gate trench 106 is formed.

Figure 2E:
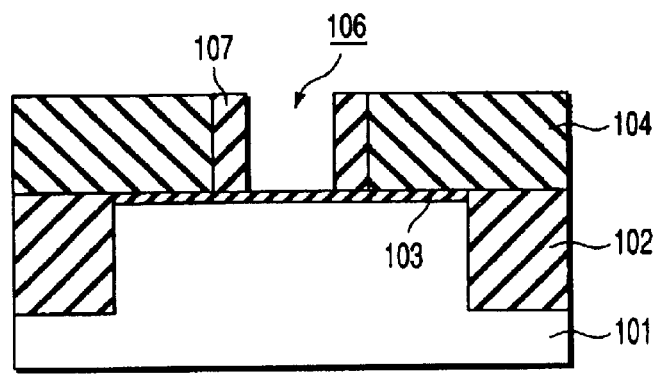

Subsequently, as shown in FIG. 2E, after removing the resist film 105, the silicon nitride film is deposited, and etched by RIE method, and the side wall insulating film 107 is formed inside the gate trench 106. Here, an ion for adjusting a transistor threshold voltage is implanted into a channel region (not shown). This gate trench 106 forms a gate forming region.

For the transistor of the present invention, since the source/drain is to be formed by Schottky junction at a low temperature (e.g., 450° C. or less), a 450° C. or higher temperature thermal treatment process does not exist after gate formation. Therefore, a highly dielectric film or a ferroelectric film ($Ta_2O_5$ film, $TiO_2$ film, $Si_3N_4$ film, (Ba, Sr)$TiO_3$, $HfO_2$, $ZrO_2$, $La_2O_3$, $Gd_2O_3$, $Y_2O_3$, $CaF_2$, $CaSnF_2$, $CeO_2$, yttria stabilized zirconia, $Al_2O_3$, $ZrSiO_4$, $HfSiO_4$, $Gd_2SiO_5$, $2La_2O_3.3SiO_2$, and the like) can be used in the gate insulating film. Moreover, a metal material (TiN, WN, Al, W, Ru, and the like) can be used in the gate electrode.

If a high-temperature process of about 800 to 1000° C. exists after gate formation, a metal gate atom is diffused in the gate insulating film to deteriorate gate breakdown voltage, a thin film layer having a low permittivity is formed in an interface between high-k film and silicon, and an effective gate insulating film thickness remarkably increases.

Here, a case will be described in which the $Ta_2O_5$ film is used as a gate insulating film material and a lamination structure of barrier metal TiN and Al is used as a metal gate material.

Figure 2F:
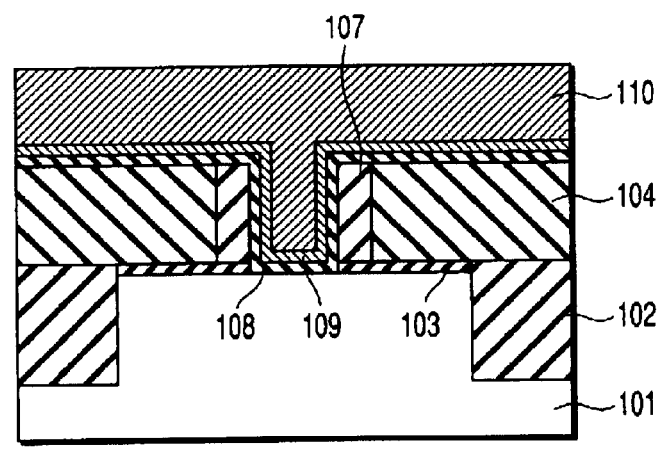

The manufacturing method will be described in detail. As shown in FIG. 2F, for example, the silicon substrate 101 is exposed in the bottom portion of the gate trench 106, and a 1 nm or thinner silicon nitride film (NO nitrided oxynitride film) is formed. Furthermore, the $Ta_2O_5$ film (gate insulating film) 108 is formed by about 4 nm by CVD method. In this case, an SiO2-equivalent gate insulator thickness is about 2 nm or less. Thereafter, the barrier metal TiN film 109 with a film thickness of about 5 nm is formed as a barrier metal by the CVD method, and the Al film 110 with a film thickness of about 300 nm is deposited by a sputtering method.

Figure 2G:
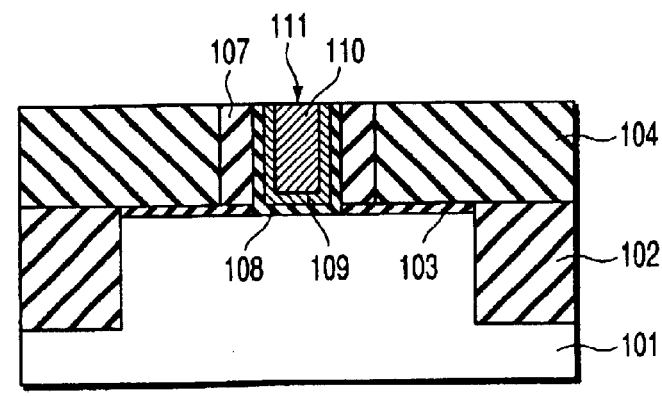

Subsequently, as shown in FIG. 2G, CMP is successively performed with respect to the Al film 110, barrier metal TiN film 109 and $Ta_2O_5$ film 108, and the metal gate electrode 111 is buried/formed in the gate trench 106.

Figure 2H:
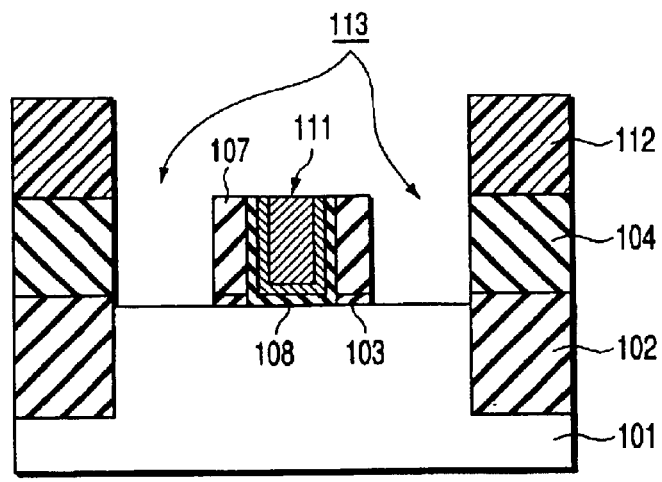

Subsequently, as shown in FIG. 2H, after a resist film 112 having an opening in the device region is formed by lithography, and the like, the resist film 112 is used as the mask to etch the interlayer insulating film 104 and $SiO_2$ film 103, and a source/drain trench 113 is formed.

The interlayer insulating film 104 is etched on the conditions that the silicon nitride film 107, $Ta_2O_5$ film 108 and metal gate electrode 111 are not etched and the $SiO_2$ film is selectively etched. Thereby, the source/drain trench 113 in which the metal gate electrode 111 is held can be formed in a self-alignment manner.

Figure 2I:
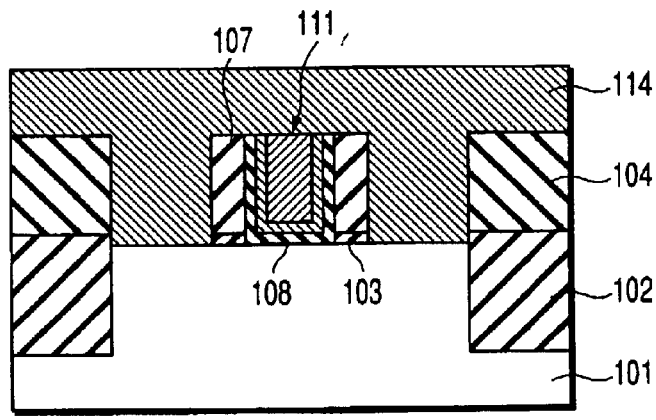
Figure 2J:
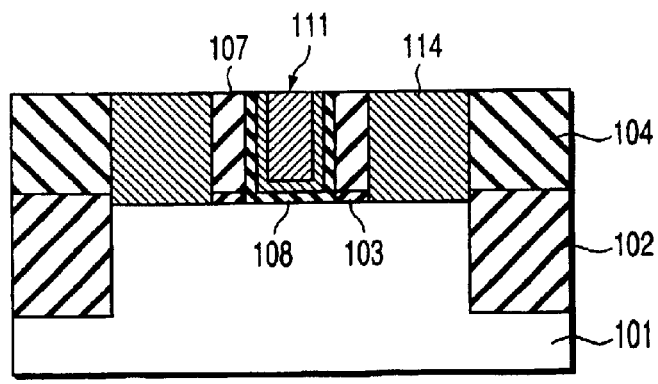

Subsequently, as shown in FIG. 2I, after the resist film 112 is removed, the Er film 114 is deposited and buried in the source/drain trench 113. Subsequently, as shown in FIG. 2J, the surface of the Er film 114 is flatted by CMP, the surface of the interlayer insulating film 104 is exposed, and the source/drain electrode 114 is formed in the source/drain trench 113.

Figure 2K:
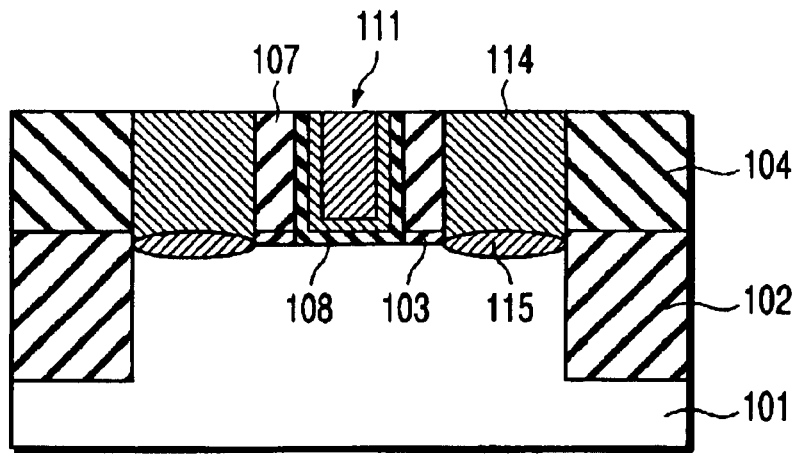

Subsequently, as shown in FIG. 2K, annealing is performed at a temperature of 450° C. or less, the silicon substrate 101 is reacted with the source and drain electrode 114, and the Schottky junctioned source/drain 115 formed of silicide such as $ErSi_2$ is formed.

Figure 2L:
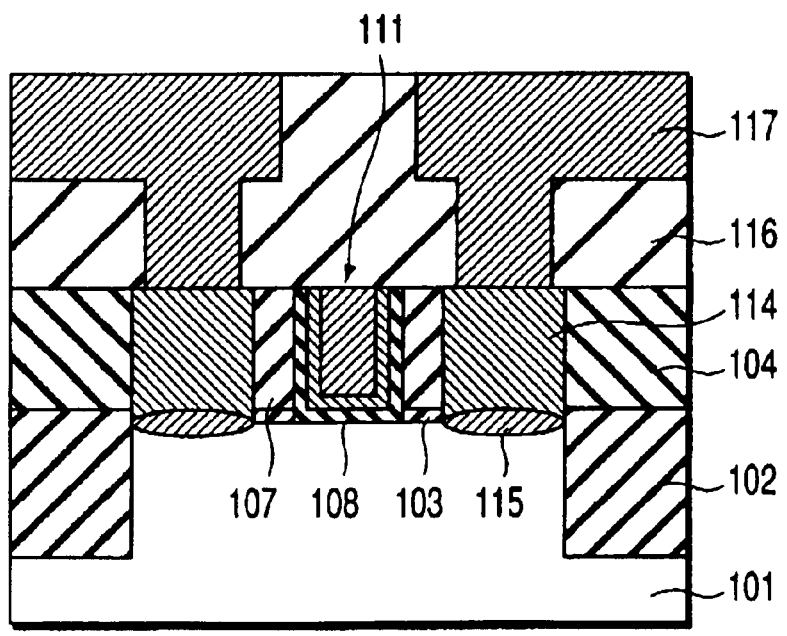

After forming the source and drain, a process is similar to a usual LSI manufacturing process. That is, as shown in FIG. 2L, an interlayer insulating film 116 of a TEOS—$SiO_2$ film is formed by the CVD method, a contact hole is made in the source/drain electrode 114 and metal gate electrode 111, and an Al wiring (upper layer metal wiring) 117 is formed in a dual damascene method.

In this case, since it is unnecessary to form and remove the dummy gate, the number of process steps can remarkably be reduced as compared with a conventional damascene gate process. Moreover, since it is unnecessary to perform the high-temperature thermal process (usually of about 1000° C.) for activating the source and drain, manufacturing is facilitated.

Furthermore, since the source and drain junctioned not by the pn junction but by Schottky junction are used, the short channel effect can be prevented even with use of the high-k gate insulating film. If the short channel effect is inhibited, the channel density can be reduced, S-factor is therefore improved, and threshold voltage can effectively be reduced.

Additionally, the following merit of the damascene gate process continues to exist as it is. That is, [1] since the gate is processed not by RIE but by CMP, a plasma damage is not introduced into the gate insulating film. [2] It is very difficult to process the metal gate on the thin gate insulating film by RIE, but this is unnecessary in the process of the present invention. [3] After the gate is processed, the surface is completely flatted, and the subsequent manufacturing process is facilitated. [4] The source/drain and gate are positioned by self-alignment.

SECOND EMBODIMENT

Figure 3:
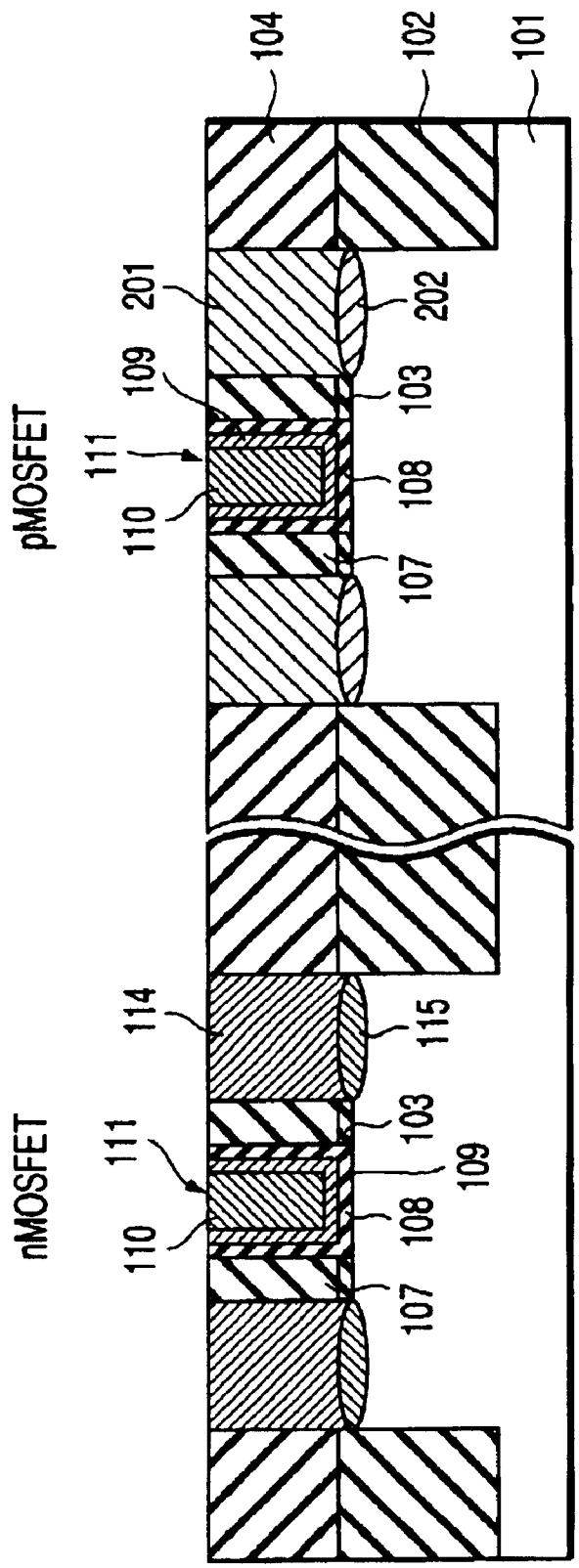
FIG. 3 is a sectional view showing a constitution of CMISFET according to a second embodiment.

FIG. 3 is a sectional view showing a constitution of CMISFET according to a second embodiment of the present invention. Additionally, FIG. 3 shows the section of the gate length direction. The same part as that of FIG. 1 is denoted with the same reference numerals, and description thereof is omitted.

In the second embodiment, the materials constituting the Schottky junctioned source/drain of nMISFET and PMISFET are different from each other. That is, in a nMISFET forming region, Er is used in the source/drain electrode 114, and $ErSi_2$ is used in the Schottky junctioned source/drain 115. In a pMISFET forming region, Pt is used in a source/drain electrode 201, and PtSi is used in a Schottky junctioned source/drain 202.

Since different metal materials are used as the source/drain materials in nMISFET and PMISFET, the second embodiment produces the following merit. That is, in the transistor in which the Schottky contact (junction) is used in the source and drain, in order to avoid a drop of current driving ability, a Schottky contact material having a small work function for N channel and a large work function for P channel is required.

In the second embodiment, erbium silicide ($ErSi_2$) having a small work function can be used in nMISFET, PtSi having a large work function can be used in pMISFET, and it is therefore possible to increase a driving current for both nMISFET and pMISFET. Moreover, when the Schottky contact material is selected, respective threshold voltages of nMISFET and pMISFET can separately be controlled.

The manufacturing method of the CMISFET shown in FIG. 3 will next be described with reference to FIGS. 4A to 4J. FIGS. 4A to 4J are process sectional views showing the manufacturing process of the CMISFET shown in FIG. 3.

Figure 4A:
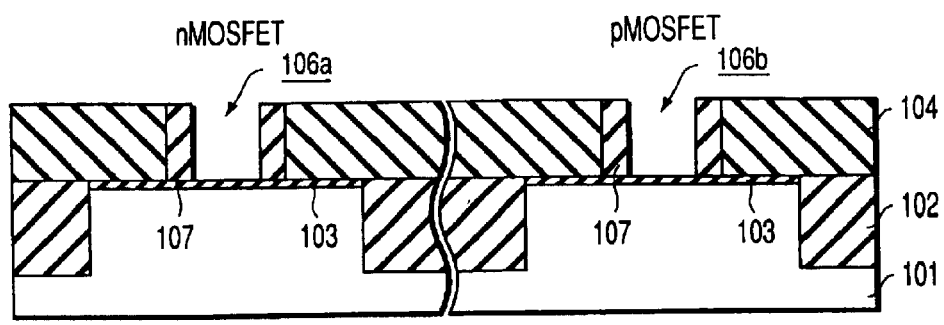

Since the structure shown in FIG. 4A is formed by the process similar to the process described in the first embodiment with reference to FIGS. 2A to 2E, the description thereof is omitted (trenches 106a and 106b are formed by processes similar to the process for forming trench 106).

Figure 4B:
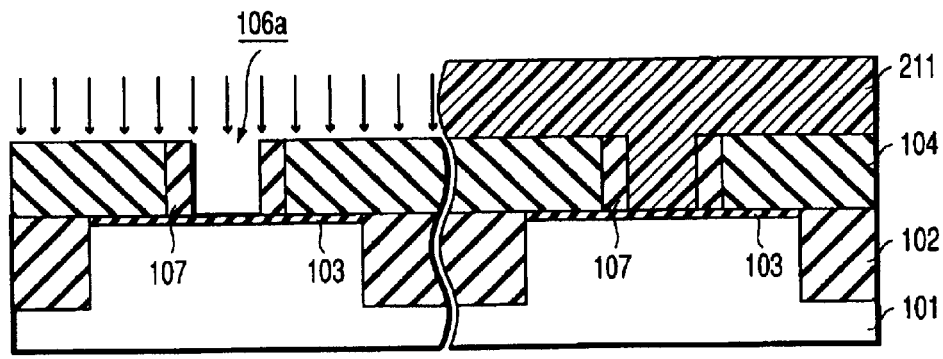
Figure 4C:
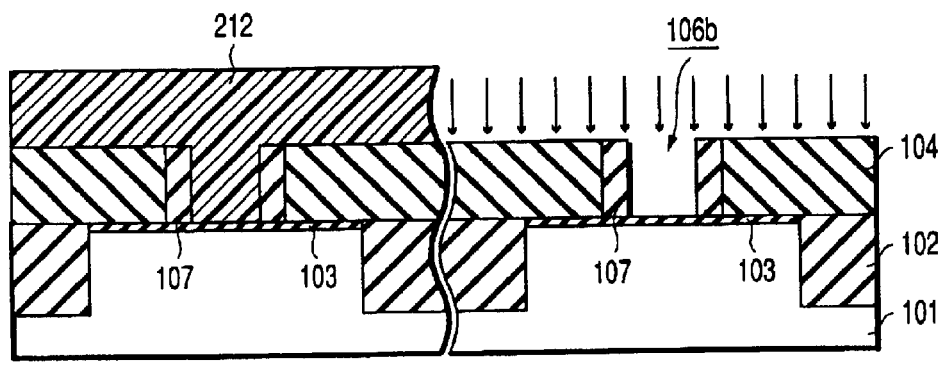

Subsequently, as shown in FIG. 4B, after a resist film 211 is selectively formed on the surface of the PMIS channel forming region, an ion for adjusting the transistor threshold voltage is implanted into the exposed surface of the silicon substrate 101 in the nMIS channel forming region. Subsequently, as shown in FIG. 4C, after the resist film 211 is removed from the surface of the PMIS channel forming region, a resist film 212 is formed on the surface of the nMIS channel forming region, and the transistor threshold voltage adjusting ion is implanted into the exposed surface of the silicon substrate 101 in the PMIS channel forming region.

For the transistor of the present invention, since the source/drain is to be formed by Schottky junction at the low temperature (e.g., 450° C. or less), the 450° C. or higher temperature thermal treatment process does not exist after gate formation. Therefore, the highly dielectric film or the ferroelectric film ($Ta_2O_5$ film, $TiO_2$ film, $Si_3N_4$ film, (Ba, Sr)$TiO_3$, $HfO_2$, $ZrO_2$, $La_2O_3$, $Gd_2O_3$, $Y_2O_3$, $CaF_2$, $CaSnF_2$, $CeO_2$, yttria stabilized zirconia, $Al_2O_3$, $ZrSiO_4$, $HfSiO_4$, $Gd_2SiO_5$, $2La_2O_3.3SiO_2$, and the like) can be used in the gate insulating film. Moreover, the metal material (TiN, WN, Al, W, Ru, and the like) can be used in the gate electrode.

Figure 4D:
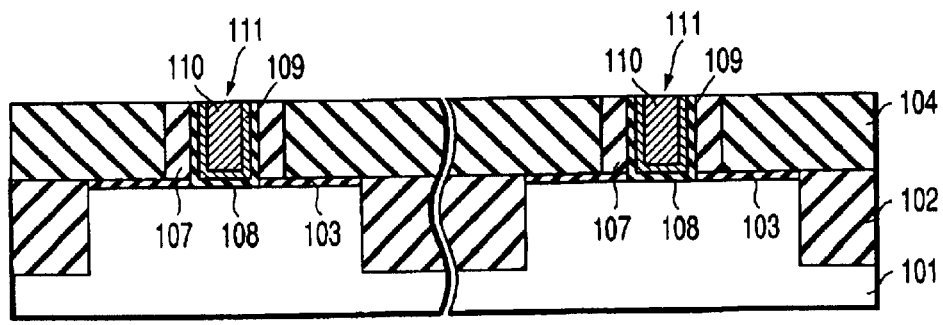

Subsequently, as shown in FIG. 4D, after removing the resist film, similarly as the first embodiment, the $Ta_2O_5$ film 108 as the gate insulating film material and the metal gate electrode 111 are formed in which the barrier metal TiN 109 and Al film 110 are laminated.

Subsequently, as shown in FIG. 4E, after a resist film 213 having the opening in the device region of the nMIS channel forming region is formed, the resist film 213 is used as the mask to selectively etch the interlayer insulating film 104, and a nMIS-side source/drain trench 214 is formed. Subsequently, as shown in FIG. 4F, the Er film 114 is deposited on the whole surface to fill the nMIS-side source/drain trench 214.

Next, as shown in FIG. 4G, the Er film 114 is chemically/mechanically polished, the surface of the interlayer insulating film 104 is exposed, and the source/drain electrode 114 is formed. Moreover, a silicide reaction is caused, for example, at a low temperature of 450° C. or less, and the nMIS-side Schottky junctioned source/drain 115 is formed in the interface between the source/drain electrode 114 and the silicon substrate 101.

Figure 4H:
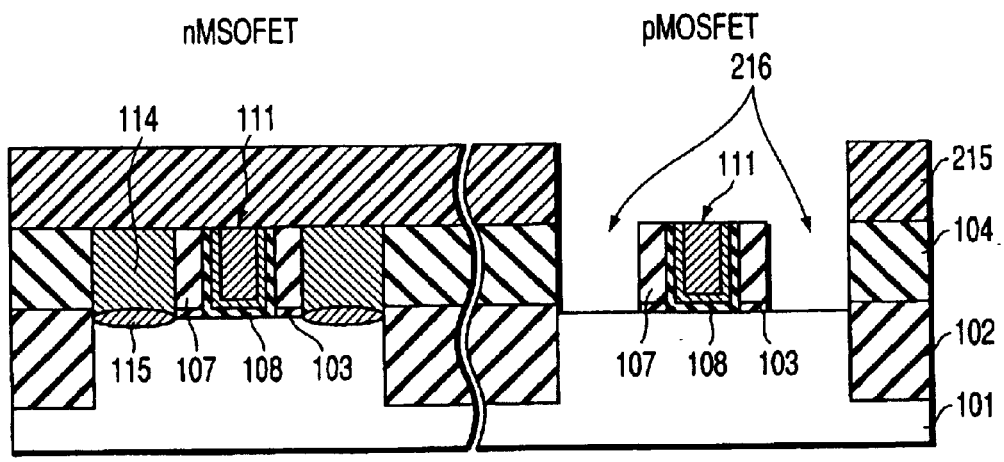
Figure 4I:
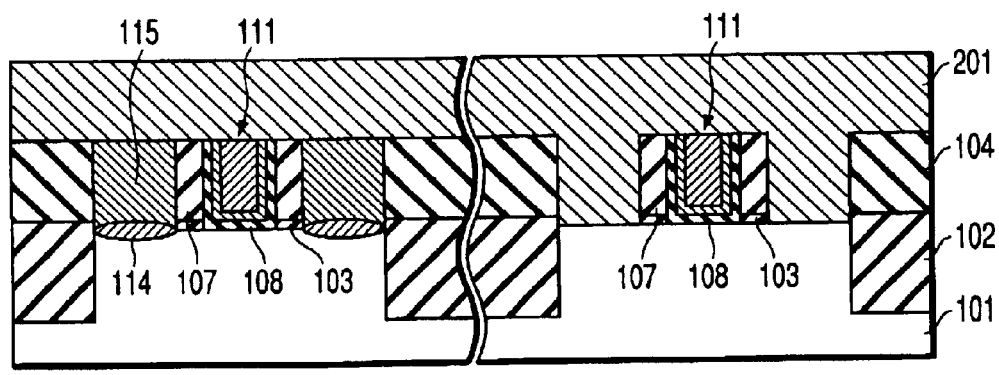

Subsequently, as shown in FIG. 4H, after a resist film 215 having the opening in the device region of the pMIS channel forming region is formed, the resist film 215 is used as the mask to selectively etch the interlayer insulating film 104, and a pMIS-side source/drain trench 216 is formed. Subsequently, as shown in FIG. 4I, the Pt film 201 is deposited on the whole surface so that the pMIS-side source/drain trench 216 is filled.

Figure 4J:
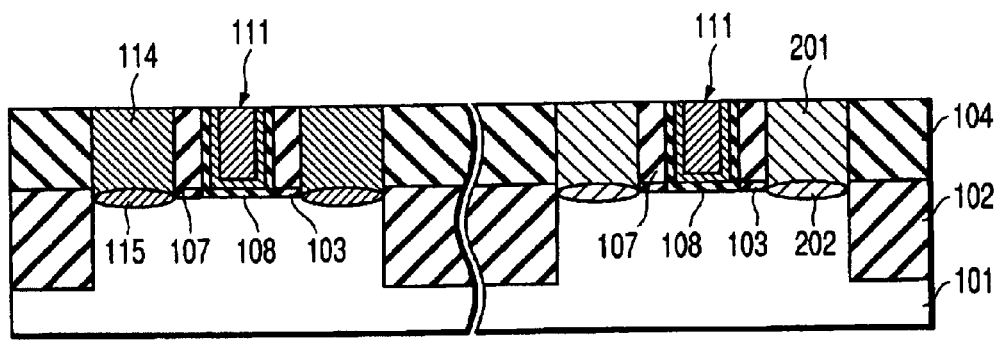

Next, as shown in FIG. 4J, the Pt film 201 is chemically/mechanically polished, the surface of the interlayer insulating film 104 is exposed, and the source/drain electrode 201 is formed in the pMIS-side source/drain trench 216. Moreover, the silicide reaction is caused, for example, at a low temperature of 450° C. or less, and the pMIS-side Schottky junctioned source/drain 202 is formed in the interface between the pMIS-side source/drain electrode 201 and the silicon substrate 101.

After forming the Schottky junctioned source and drain, the process is similar to the usual LSI manufacturing process. That is, the interlayer insulating film TEOS is deposited by CVD, the contact hole is made in the source/drain electrodes 114, 201 and metal gate electrode 111, and the upper layer metal wiring (e.g., Al wiring) 117 is formed in the dual damascene method. Since these sectional views are similar to those of the first embodiment, the views are omitted.

In this case, since it is unnecessary to form and remove the dummy gate, the number of process steps can remarkably be reduced as compared with the conventional damascene gate process. Moreover, since it is unnecessary to perform the high-temperature thermal process (usually of about 1000° C.) for activating the source and drain, manufacturing is facilitated.

Furthermore, since the source and drain junctioned not by the pn junction but by Schottky junction are used, the short channel effect can be prevented even with use of the high-k gate insulating film. If the short channel effect is inhibited, the channel density can be reduced, S-factor is therefore improved, and threshold voltage can effectively be reduced.

Additionally, since different metal materials are used as the source/drain materials in nMISFET and pMISFET in the second embodiment, the following merit is generated. That is, in the transistor in which the Schottky contact (junction) is used in the source and drain, in order to avoid the drop of current driving ability, the Schottky contact material having a small work function for N channel and a large work function for P channel is required.

In the second embodiment, erbium silicide ($ErSi_2$) having a small work function can be used in nMISFET, PtSi having a large work function can be used in PMISFET, and it is therefore possible to increase a driving current for both nMISFET and pMISFET. Moreover, when the Schottky contact material is selected, the respective threshold voltages of nMISFET and pMISFET can separately be controlled.

Additionally, in the second embodiment, a manufacturing order of the nMIS source/drain and pMIS source/drain may be reversed.

THIRD EMBODIMENT

Figure 5:
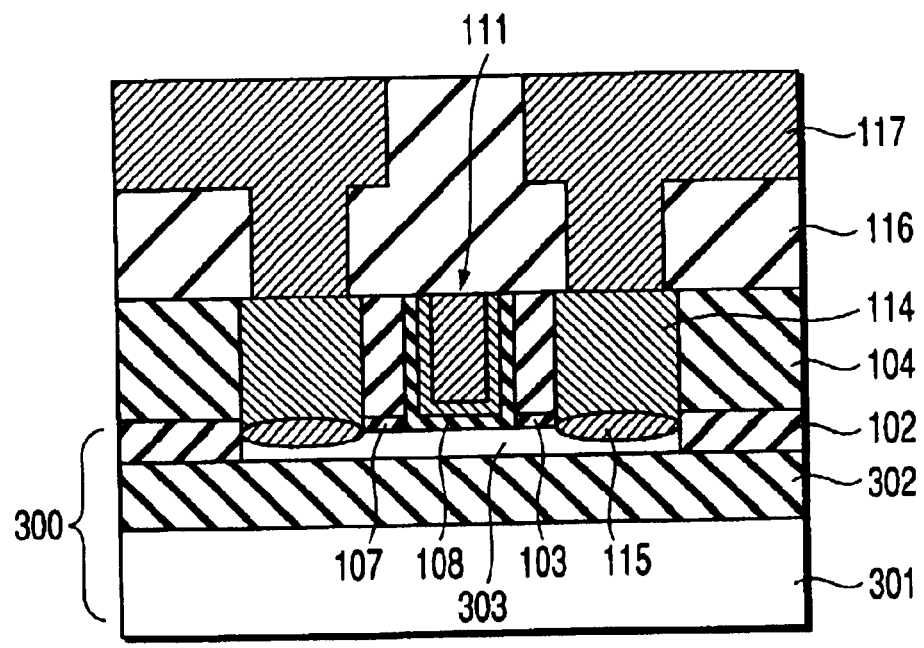
FIG. 5 is a sectional view showing a constitution of nMISFET according to a third embodiment.

FIG. 5 is a sectional view showing a constitution of nMISFET according to a third embodiment of the present invention. Additionally, FIG. 5 shows the section of the gate length direction. In FIG. 5, the same part as that of FIG. 1 is denoted with the same reference numerals, and the description thereof is omitted.

Characteristics of the third embodiment lie in that a SOI substrate 300 including a support silicon substrate 301, buried oxide film 302, and silicon layer 303 is used. Since other constitutions are similar to those of the first embodiment, the description of the manufacturing method is omitted.

According to the third embodiment, the effect (merit) similar to that of the first embodiment is obtained, and additionally the following merit is obtained. That is, since the Schottky junction is applied to the source/drain of SOI-MISFET, Schottky contact characteristics can be utilized to compensate for a drawback of a semiconductor device using the SOI substrate. Additionally, the SOI substrate can be utilized to remove the drawback of the Schottky contact.

This respect will be described below in more detail.

[1] A floating body effect problem of SOI-MISFET can be solved by an effect of Schottky barrier both in the source and drain.

[2] Since the SOI structure can be used to depress a leak current in a drain contact, a transistor off current (consumption power) can be reduced.

FOURTH EMBODIMENT

Figure 6:
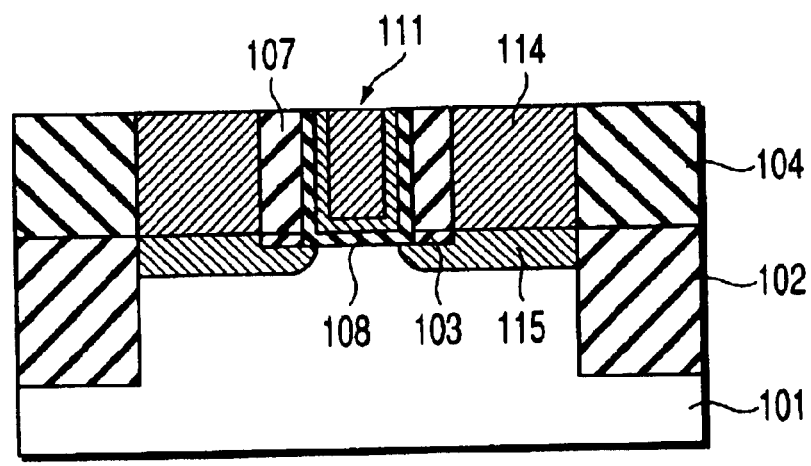
FIG. 6 is a sectional view showing a constitution of nMISFET according to a fourth embodiment.

FIG. 6 is a sectional view showing a constitution of nMISFET according to a fourth embodiment of the present invention. Additionally, FIG. 6 shows the section of the gate length direction.

The characteristics of the fourth embodiment lie in that the Schottky Functioned source/drain 115 is formed to extend under the side wall insulating film 107.

According to the fourth embodiment, the merit similar to that of the first embodiment is obtained. Additionally, the following merit is obtained. That is, when a distance between the gate electrode and the source/drain is shortened, a transistor parasitic resistance can be reduced, and a high driving ability can be realized.

Figure 7A:
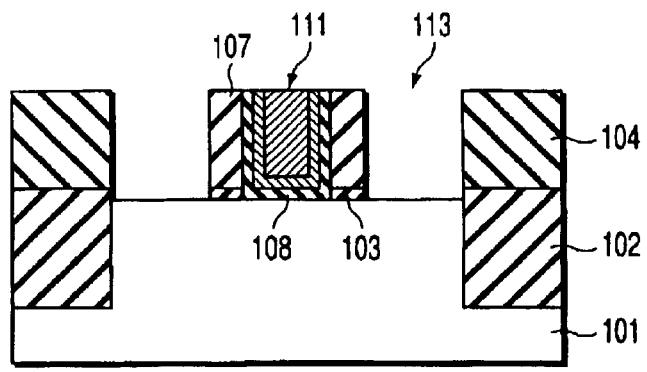
FIGS. 7A to 7D are process sectional views showing a manufacturing process of the nMISFET shown in FIG. 6.
Figure 7B:
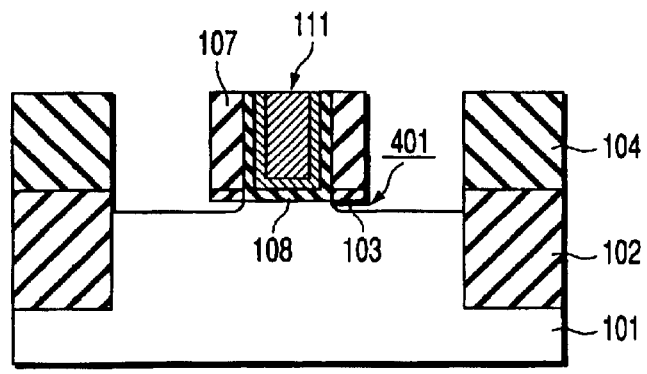

The manufacturing method of nMISFET shown in FIG. 6 will next be described with reference to FIGS. 7A to 7D. Since the structure shown in FIG. 7A is formed through the process described in the first embodiment with reference to FIGS. 2A to 2H, the description thereof is omitted. The subsequent process will be described in order. As shown in FIG. 7B, the silicon substrate exposed to the bottom portion of the source/drain trench 113 is etched by about 30 nm by CDE, and an undercut 401 is formed under the gate side wall.

Figure 7C:
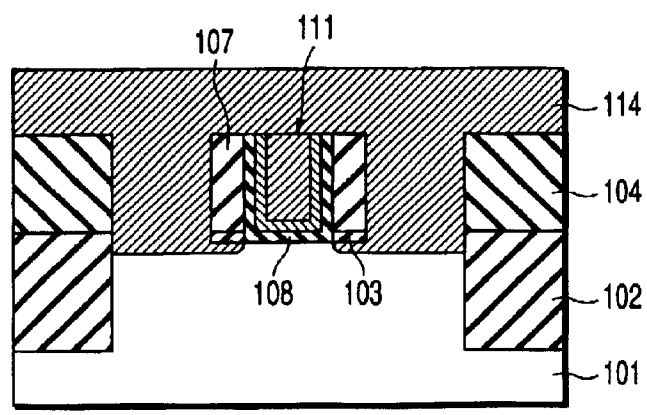
Figure 7D:
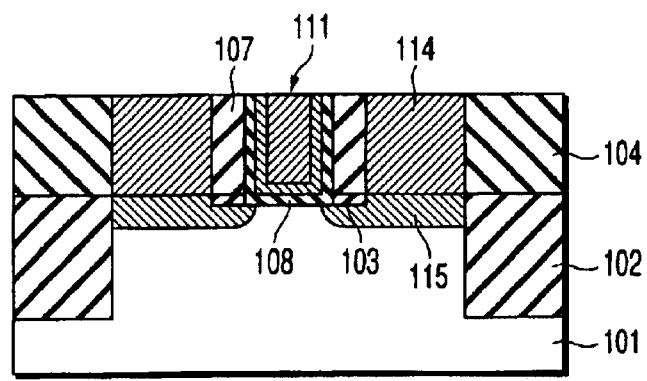

Subsequently, as shown in FIG. 7C, the Er film is formed to fill the source/drain trench 113 in which the undercut 401 is completed. Next, as shown in FIG. 7D, the surface of the Er film 114 is flatted by CMP, the surface of the interlayer insulating film 104 is exposed, and the source/drain electrode 114 is formed in the source/drain trench 113. Moreover, the annealing is performed at the temperature of 450° C. or less, the silicon substrate 101 is reacted with the source/drain electrode 114, and the Schottky junctioned source/drain 115 formed of $ErSi_2$ is formed.

According to the fourth embodiment, the merit similar to that of the first embodiment is obtained. Additionally, the following merit is obtained. That is, an offset amount (or an overlap amount) between the gate and the source/drain can be controlled, the transistor parasitic resistance can be reduced, and the high driving ability can be realized. Additionally, the silicon substrate is eroded during silicide forming reaction of the source/drain, and the source/drain metal material sometimes turns to a portion under the gate side wall even if CDE is not performed as described above.

FIFTH EMBODIMENT

FIGS. 8A to 8H are process sectional views showing the manufacturing process of the nMISFET according to a fifth embodiment of the present invention. Additionally, FIGS. 8A to 8H show the sections of the gate length direction.

Figure 8A:
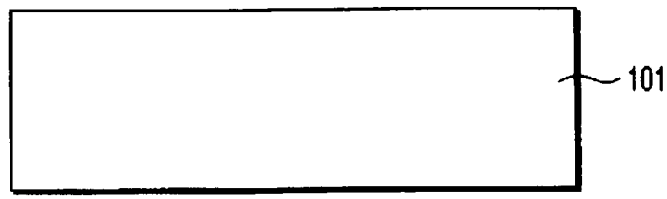
FIGS. 8A to 8H are process sectional views showing a manufacturing process of the nMISFET according to a fifth embodiment.
Figure 8B:
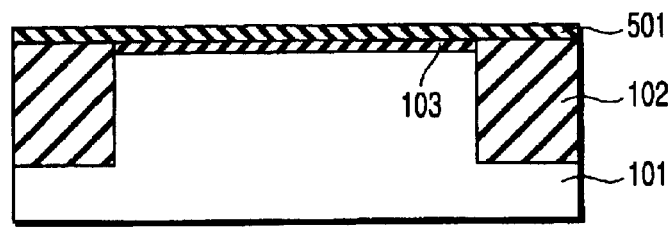
Figure 8C:
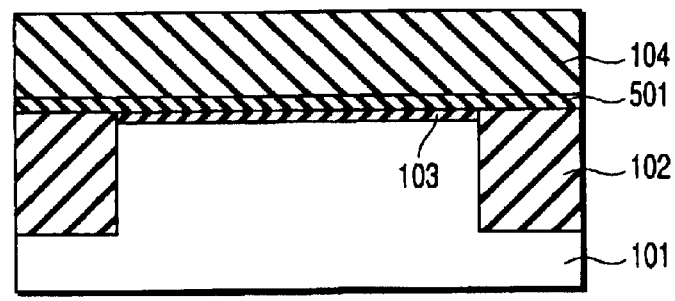

The process will be described in order. First as shown in FIG. 8A, the semiconductor silicon substrate 101 is prepared. Subsequently, as shown in FIG. 8B, in order to separate the devices by the shallow trench isolation (STI), the trench with a depth of about 200 nm is formed in the device isolating region, the TEOS—$SiO_2$ film is buried/formed in the trench and the device isolating insulating film 102 is formed. Moreover, after the $SiO_2$ film 103 is formed on the surface of the silicon substrate 101 by thermal oxidation of about 5 nm, an about 10 nm thick silicon nitride film 501 is formed. Subsequently, as shown in FIG. 8C, the TEOS—$SiO_2$ film with a film thickness of about 150 nm is deposited on the silicon nitride film 501 by the LPCVD method, and the interlayer insulating film 104 is formed.

Figure 8D:
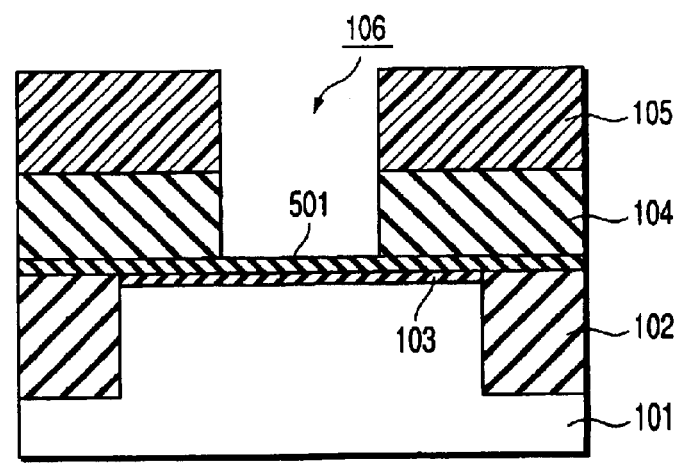

Subsequently, as shown in FIG. 8D, after the resist film 105 having the opening in the channel forming region is formed by EB direct drawing or lithography, the interlayer insulating film 104 in the gate forming region is etched by RIE method, and a gate trench 106 is formed. In this case, the silicon nitride film 501 serves as a RIE stopper, and prevents the silicon substrate 101 from being etched.

Figure 8E:
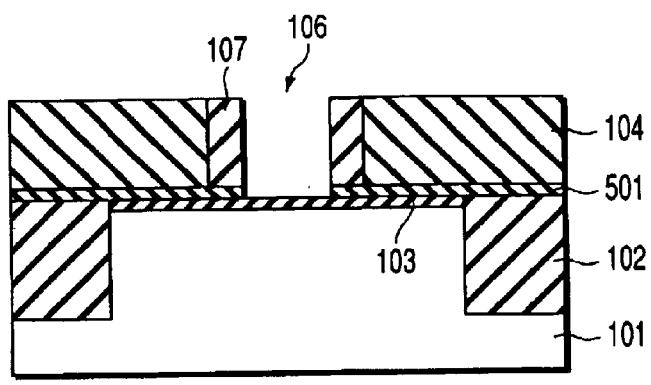

Subsequently, as shown in FIG. 8E, after the resist film 105 is removed, the silicon nitride film is deposited and etched by the RIE method. Thereby, the side wall insulating film 107, for example, of the silicon nitride film is formed inside the gate trench 106. During the RIE process for forming the side wall insulating film 107, the silicon nitride film 501 exposed in the trench bottom portion is also removed. However, if the film remains, the film is removed by hot phosphoric acid or RIE.

Figure 8F:
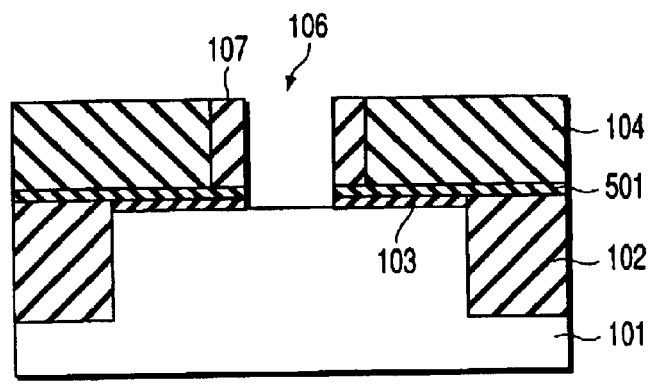

Subsequently, as shown in FIG. 8F, the ion (not shown) for adjusting the transistor threshold voltage is implanted into the channel region, and the $SiO_2$ film 103 is removed by HF treatment.

Figure 8G:
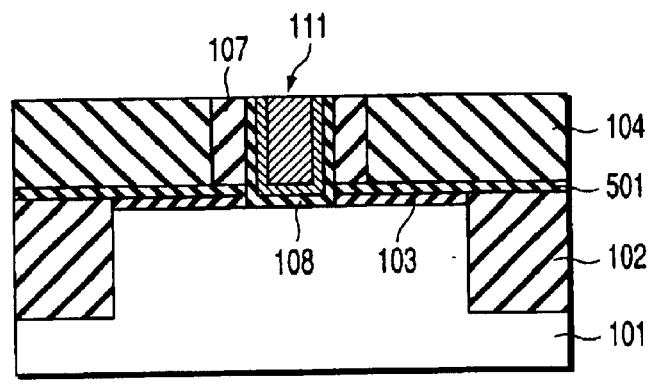

The subsequent process is similar to that of the other embodiments. That is, as shown in FIG. 8G, the damascene process is used to form and bury the metal gate electrode 111 of the lamination structure including the $Ta_2O_5$ film 108 as the gate insulating film material, barrier metal TiN 109 and Al film 110 in the gate trench 106.

Figure 8H:
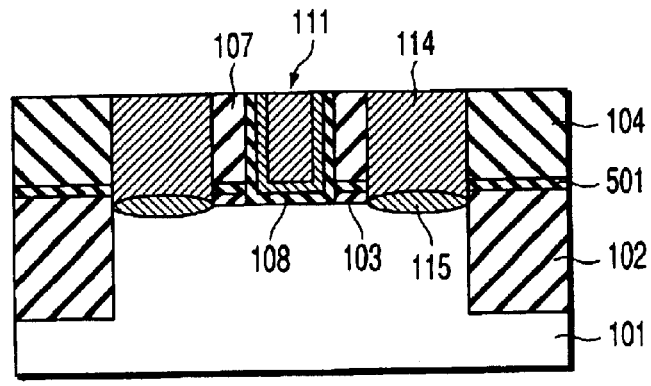

Subsequently, as shown in FIG. 8H, after the source/drain trench is formed, the source/drain electrode 114 of the Er film is buried/formed in the source/drain trench, and annealed at a low temperature of 450° C. or less. Then, the Schottky junctioned source/drain 115 is formed in the interface between the source/drain electrode 114 and the silicon substrate 101.

According to the fifth embodiment, the merit similar to that of the first embodiment is obtained. Additionally, the following merit is obtained. That is, the about 10 nm thick silicon nitride film 501 formed between the interlayer insulating film 104 and the about 5 nm thick $SiO_2$ film 103 is used to etch the interlayer insulating film 104 of the gate forming region by RIE method, and the gate trench 106 is formed. In this case, the silicon nitride film 501 serves as the RIE stopper, and prevents the silicon substrate 101 from being etched or damaged by RIE. Therefore, a property of MIS interface can remarkably be improved.

SIXTH EMBODIMENT

FIGS. 9A to 9D are process sectional views showing the manufacturing process of the nMISFET according to a sixth embodiment of the present invention. Additionally, FIGS. 9A to 9D show the section of the gate length direction.

Figure 9A:
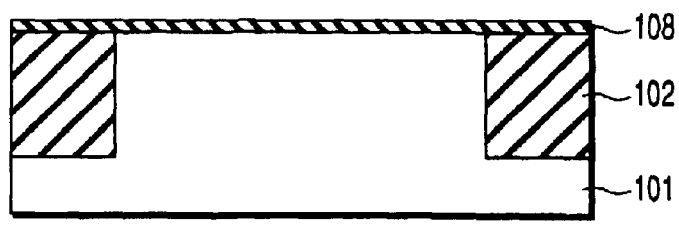
FIGS. 9A to 9D are process sectional views showing a manufacturing process of the nMISFET according to a sixth embodiment.

In the sixth embodiment, the metal gate is formed by RIE process, not by the damascene process. The process will be described in order. First, as shown in FIG. 9A, the device isolating insulating film 102 using STI technique is formed on the semiconductor silicon substrate 101, and the transistor threshold voltage adjusting ion is implanted into the channel region. Subsequently, the $Ta_2O_5$ film 108 is formed as the gate insulating film material on the silicon substrate surface.

Figure 9B:
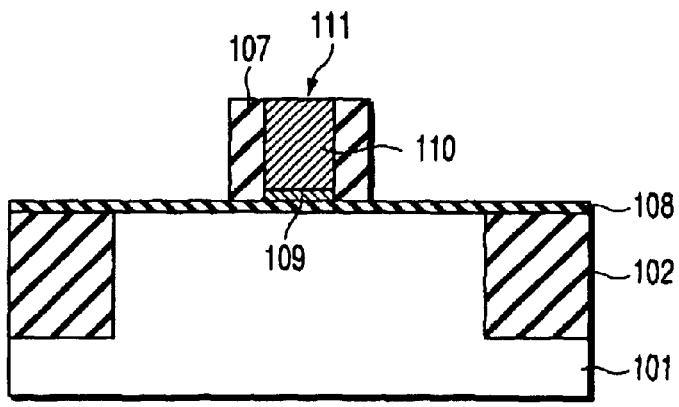
Figure 9C:
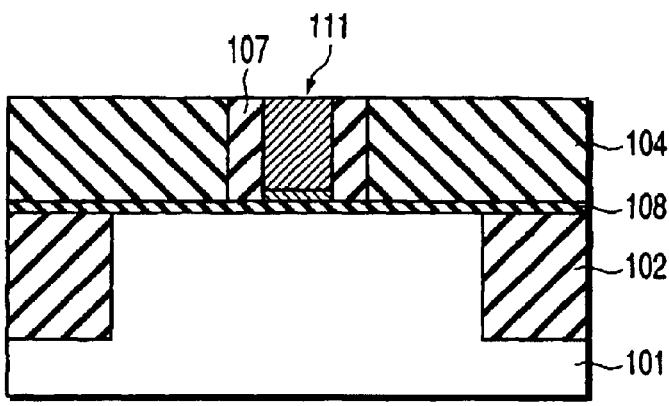

Subsequently, as shown in FIG. 9B, after the barrier metal TiN film 109 and Al film 110 are successively deposited as the metal gate material, and patterned into a gate pattern by EB direct drawing or lithography and RIE process, the metal gate electrode 111 is formed. Moreover, the side wall insulating film 107, for example, of the silicon nitride film is formed in the side surface of the metal gate electrode 111. Subsequently, as shown in FIG. 9C, after the about 200 nm thick TEOS—SIO$_2$ film is deposited, and flatted by CMP, the interlayer insulating film 104 is formed.

Figure 9D:
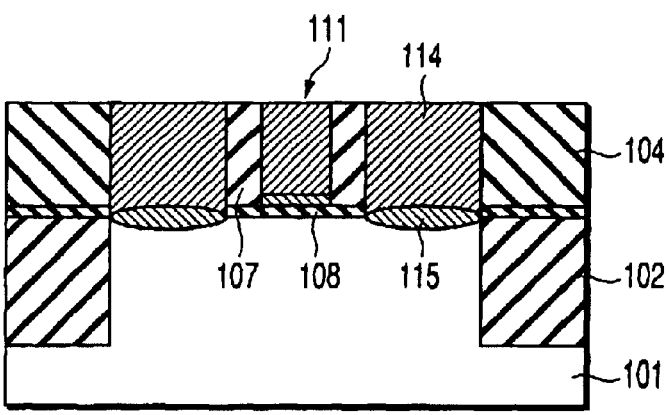

The subsequent process is similar to that of the other embodiments. As shown in FIG. 9D, after the interlayer insulating film 104 of the source/drain region is etched/removed, the source/drain electrode 114 and Schottky junctioned source/drain 115 are formed.

According to the sixth embodiment, since it is unnecessary to form and remove the dummy gate, the number of process steps can remarkably be reduced as compared with the conventional damascene gate process. Moreover, since it is unnecessary to perform the high-temperature thermal process (usually of about 1000° C.) for activating the source and drain, the manufacturing is facilitated. Furthermore, since the source and drain junctioned by the Schottky junction, not by pn junction are used, the short channel effect can be prevented even with the use of the high-k gate insulating film. If the short channel effect is inhibited, the channel density can be reduced, S-factor is therefore improved, and threshold voltage can effectively be reduced. Of course, the source/drain and gate are positioned by self-alignment.

SEVENTH EMBODIMENT

In the first embodiment, the manufacturing method of nMISFET shown in FIG. 1 has been described with reference to FIGS. 2A to 2L. In the seventh embodiment, the manufacturing method of nMISFET different from the manufacturing method described with reference to FIGS. 2A to 2L will be described.

FIGS. 10A to 10G are process sectional views showing the manufacturing process of the nMISFET according to the seventh embodiment of the present invention.

Figure 10A:
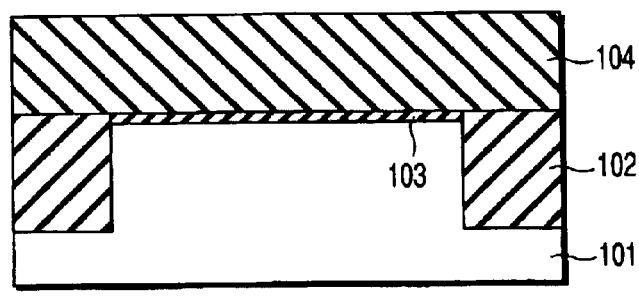
FIGS. 10A to 10G are process sectional views showing a manufacturing process of the nMISFET according to a seventh embodiment.

First, since the structure shown in FIG. 10A is formed through the process described in the first embodiment with reference to FIGS. 2A to 2C, the description thereof is omitted.

Figure 10B:
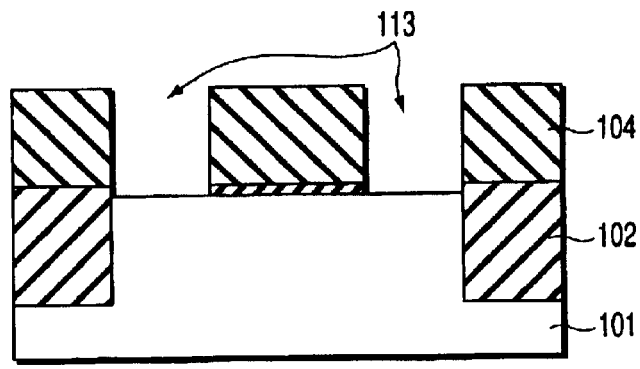

Subsequently, as shown in FIG. 10B, after the resist film having the opening in a MISFET source and drain forming region is formed, the resist film is used as the mask to selectively etch the interlayer insulating film 104 and Sio$_2$ film 103, and the source/drain trench 113 is formed.

Figure 10C:
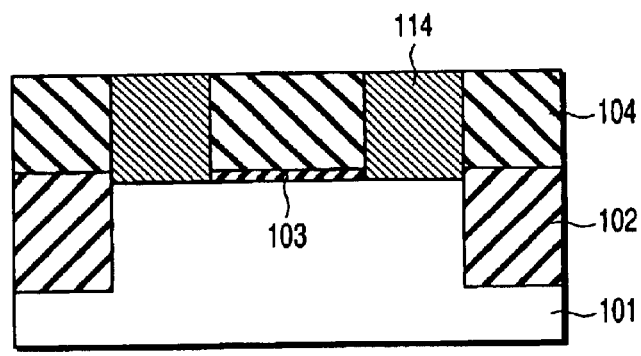
Figure 10D:
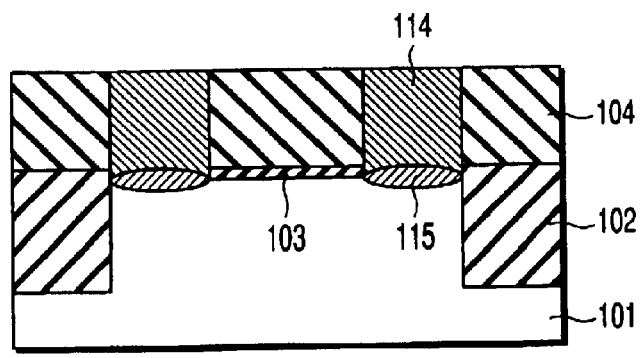

Subsequently, as shown in FIG. 10C, the damascene method is used to bury/form the metal material 114 for reacting with silicon to form silicide in the source/drain trench. Moreover, as shown in FIG. 10D, the metal material 114 is reacted with the silicon substrate 101 and the Schottky Functioned source/drain 115 of silicide is formed.

Additionally, in the process shown in FIG. 10B, the undercut may be formed under the gate side wall by etching the silicon substrate exposed to the bottom portion of the source/drain trench 113 by about 30 nm by CDE, so that the Er film is buried/formed in the undercut. Then, since the Schottky Functioned source/drain 115 is formed to extend to the portion under the side wall insulating film 107 described later, the distance between the gate electrode and the source/drain is shortened, the transistor parasitic resistance can therefore be reduced, and the high driving ability can be realized.

Figure 10E:
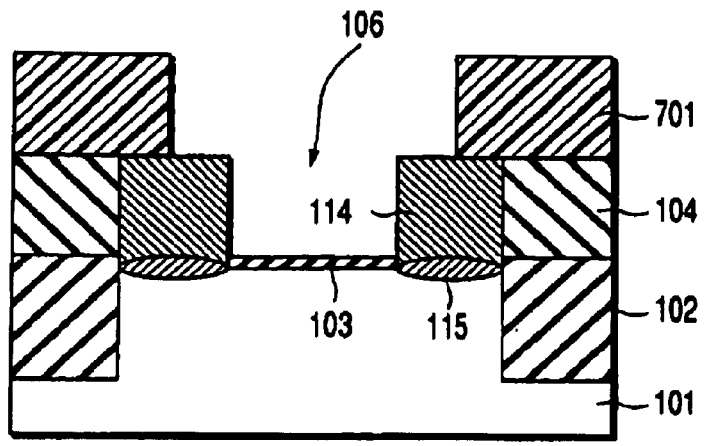

Subsequently, as shown in FIG. 10E, a resist film 701 having an opening on the interlayer insulating film 104 between the source/drain metal electrodes 114 formed on the Schottky junctioned source/drain 115 is formed. Moreover, the resist film 701 is used as the mask to selectively etch the interlayer insulating film 104, and the gate trench 106 is formed in which opposite side surfaces of the source/drain electrode are exposed.

Figure 10F:
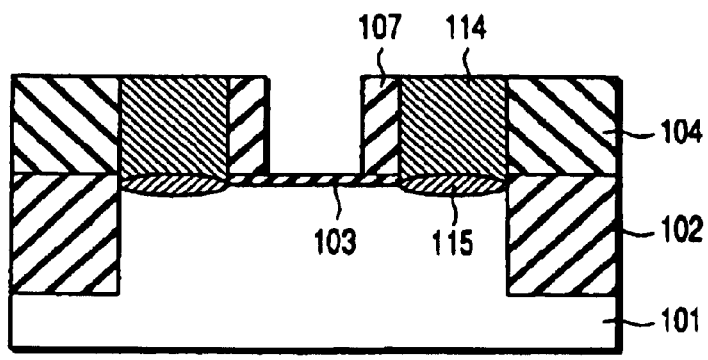

Subsequently, as shown in FIG. 10F, after the resist film 701 is removed, the silicon nitride film is deposited and etched by RIE method, and the side wall insulating film 107 is formed inside the gate trench 106. Here, if necessary, the transistor threshold voltage adjusting ion is implanted into the channel region silicon substrate 101 via the SiO$_2$ film 103 (not shown).

Figure 10G:
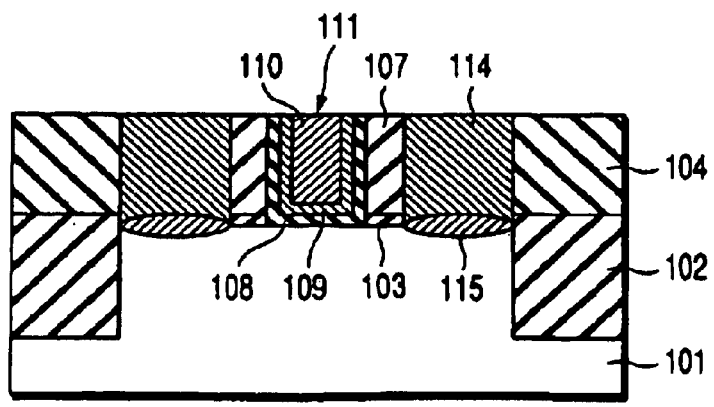

Subsequently, as shown in FIG. 10G, similarly as the first embodiment, the metal gate electrode 111 is formed in which the Ta$_2$O$_5$ film 108 as the gate insulating film material, barrier metal TiN 109 and Al film 110 are laminated.

In the seventh embodiment, the metal material to be buried in the source/drain trench can be different from that of the first embodiment. Any metal can be used as long as the metal reacts with silicon to form silicide. In the first embodiment, after the gate insulating film and metal gate electrode formation, the source and drain are formed. Therefore, the source/drain silicide has to be formed at 450° C. or less. In the seventh embodiment, after forming the source/drain, the gate electrode is formed, so that the source/drain silicide can be formed at a high temperature.

Moreover, after the trench with the source/drain electrode 114 exposed therein is formed, the side wall insulating film is formed in the trench side wall and the gate trench is formed, so that the gate electrode can be formed in the self-aligned manner with respect to the source/drain.

EIGHTH EMBODIMENT

In the second embodiment, the manufacturing method of the CMISFET shown in FIG. 3 has been described with reference to FIGS. 4A to 4J. In an eighth embodiment, the CMISFET manufacturing method different from the manufacturing method described with reference to FIGS. 4A to 4J will be described.

FIGS. 11A to 11L are process sectional views showing a manufacturing process of the CMISFET according to an eighth embodiment of the present invention.

Figure 11A:
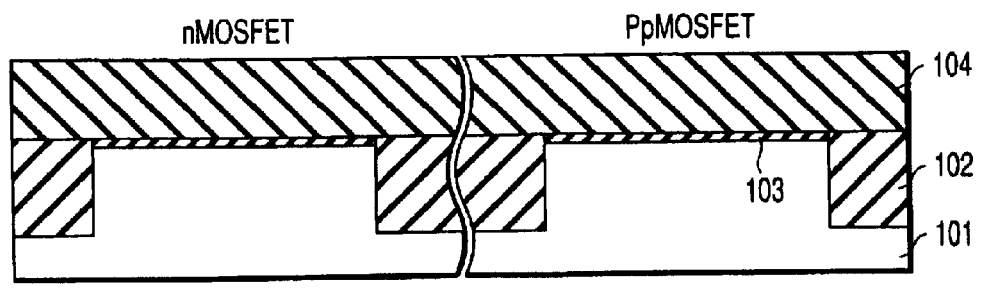
FIGS. 11A to 11L are process sectional views showing a manufacturing process of the CMISFET according to an eighth embodiment.

First, since the structure shown in FIG. 11A is formed by the process described with reference to FIGS. 2A and 2B, the description thereof is omitted.

Figure 11B:
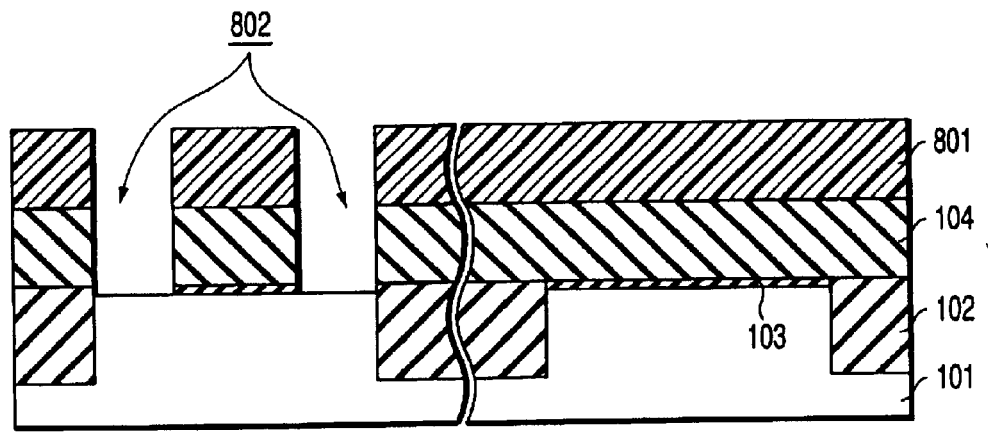
Figure 11C:
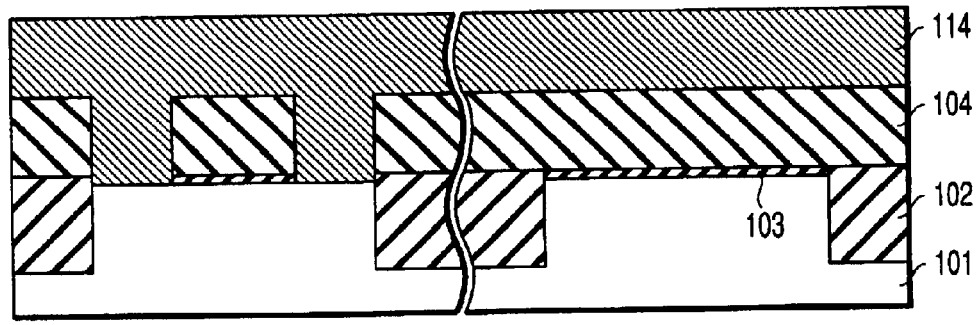

Subsequently, as shown in FIG. 11B, after a resist film 801 having an opening in a nMIS source/drain forming region is formed, the resist film 801 is used as the mask to selectively etch the interlayer insulating film 104, and a nMIS-side source/drain trench 802 is formed. Subsequently, as shown in FIG. 11C, the Er film 114 is deposited on the whole surface so that the nMIS-side source/drain trench 802 is filled.

Figure 11D:
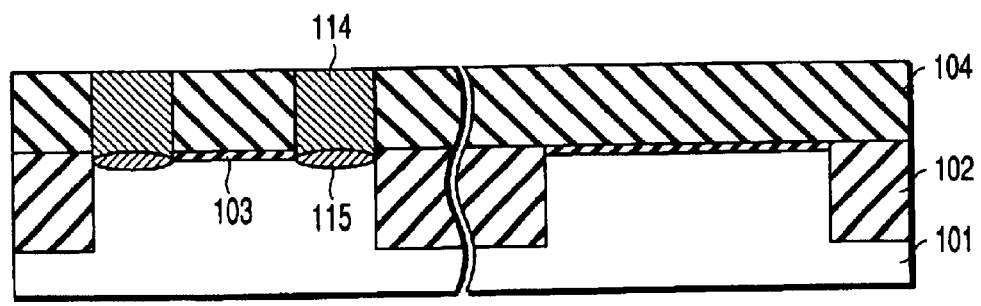

Next, as shown in FIG. 11D, the Er film 114 is chemically/mechanically polished, the surface of the interlayer insulating film 104 is exposed, and the source/drain electrode 114 is formed. Moreover, the nMIS-side Schottky source/drain 115 is formed in the interface between the source/drain electrode 114 and the silicon substrate 101.

Figure 11E:
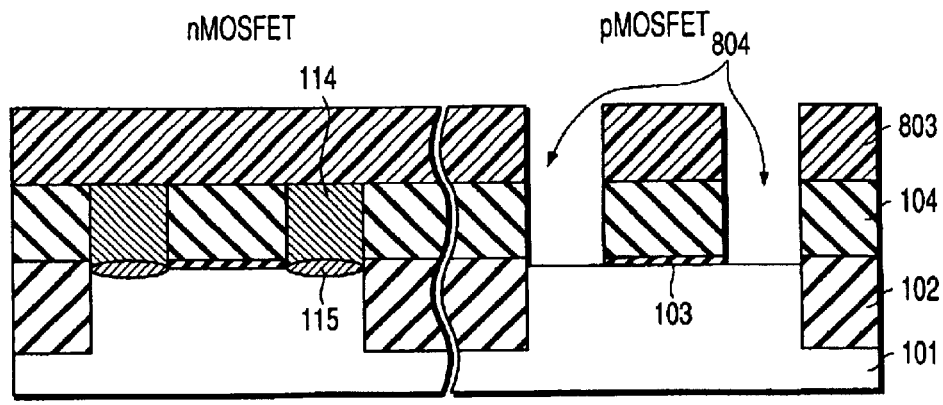
Figure 11F:
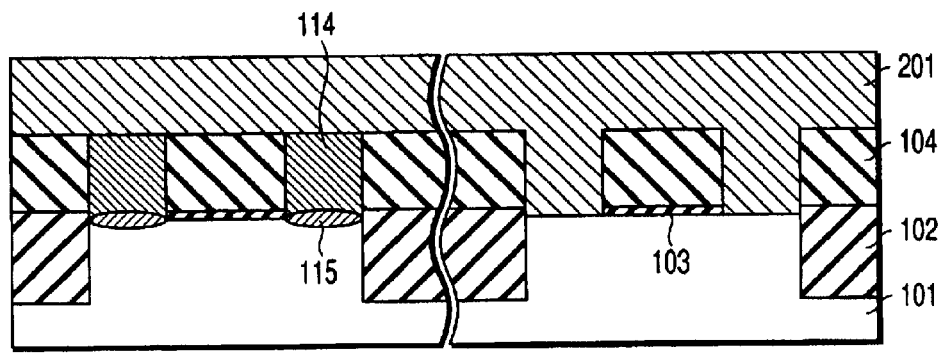

Subsequently, as shown in FIG. 11E, after a resist film 803 having the opening in a pMIS source/drain forming region is formed, the resist film 803 is used as the mask to selectively etch the interlayer insulating film 104, and a pMIS-side source/drain trench 804 is formed. Subsequently, as shown in FIG. 11F, the Pt film 201 is deposited on the whole surface so that the pMIS-side source/drain trench 804 is filled.

Figure 11G:
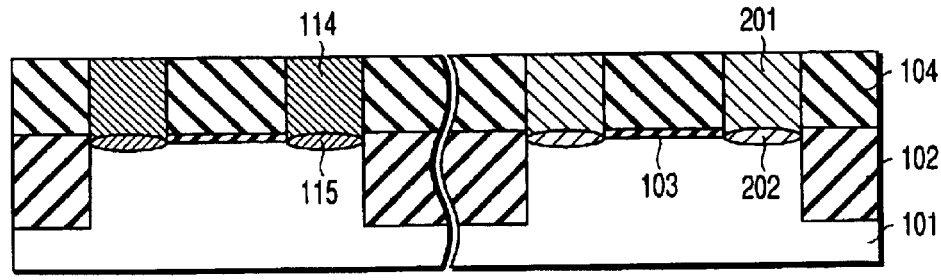

Next, as shown in FIG. 11G, the Pt film 201 is chemically/mechanically polished, the surface of the interlayer insulating film is exposed, and the source/drain electrode 201 is formed in the pMIS-side source/drain trench 804. Moreover, the silicide reaction is caused, for example, at a low temperature of 450° C. or less, and the pMIS-side Schottky source/drain 202 is formed in the interface between the pMIS-side source/drain electrode 201 and the silicon substrate 101.

Figure 11H:
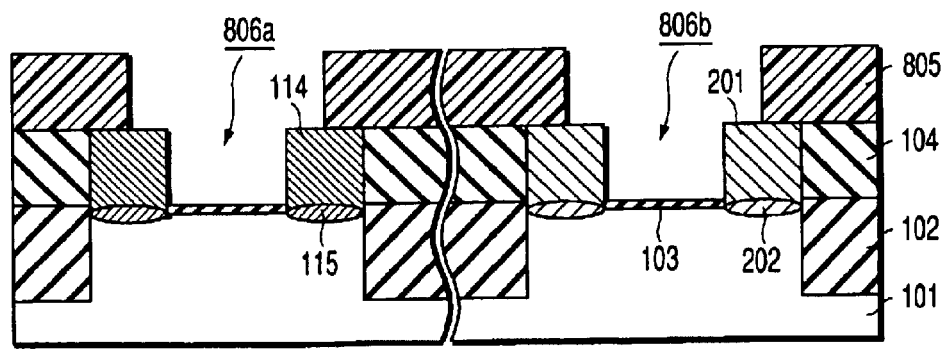
Figure 11I:
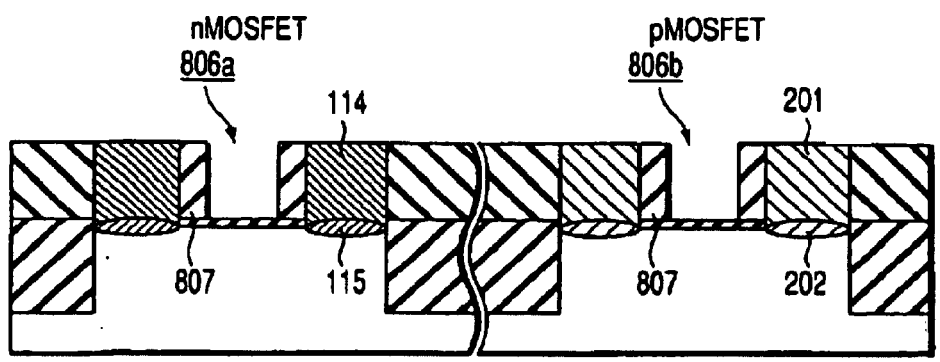

Subsequently, as shown in FIG. 11H, a resist film 805 having the opening in a part of the source/drain electrodes 114, 201, and on the interlayer insulating film 104 between the source/drain 115, 202 is formed. Moreover, the resist film 805 is used as the mask to form gate trenches 806a, 806b in which opposite side surfaces of the pMIS and nMIS-side source/drain electrodes 114, 201 are exposed. Subsequently, as shown in FIG. 11I, the silicon nitride film is deposited, and etched by RIE method, and a side wall insulating film 807 is formed inside the gate trench 106.

Figure 11J:
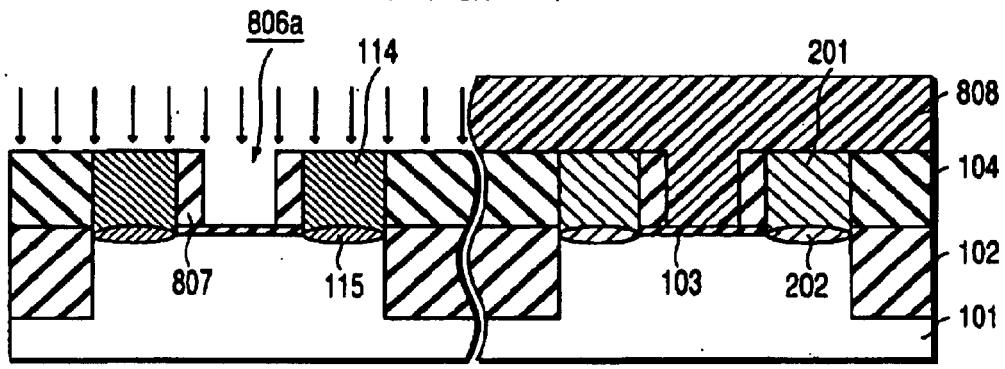
Figure 11K:
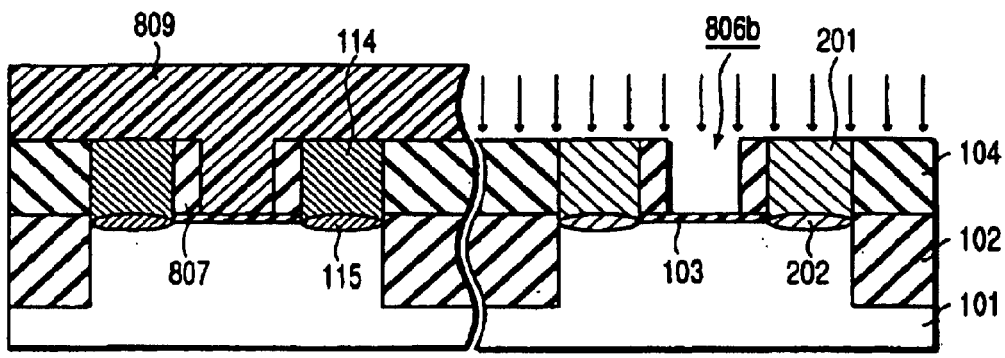

Subsequently, as shown in FIG. 11J, after a resist film 808 is selectively formed on the surface of the pMIS channel forming region, the transistor threshold voltage adjusting ion is implanted into the surface of the silicon substrate 101 exposed in a bottom surface of the gate trench 806a of the nMIS channel forming region. Subsequently, as shown in FIG. 11K, after the resist film 808 is removed from the surface of the pMIS channel forming region, a resist film 809 is formed on the surface of the nMIS channel forming region, and the transistor threshold voltage adjusting ion is implanted into the surface of the silicon substrate 101 exposed to the bottom surface of the gate trench 806b of the pMIS channel forming region.

Figure 11L:
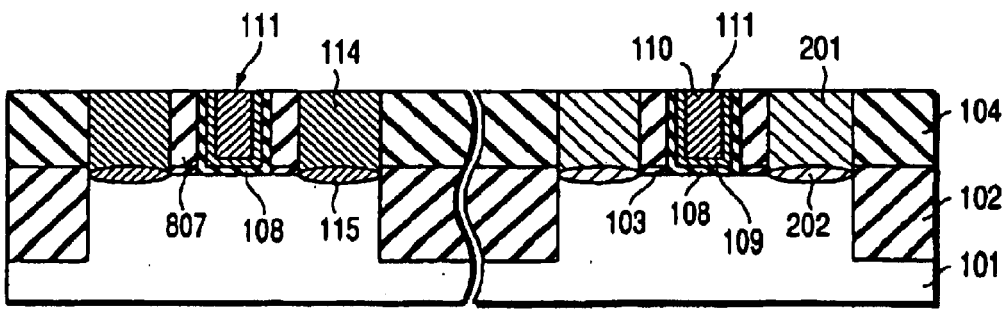

Subsequently, as shown in FIG. 11L, similarly as the first embodiment, the metal gate electrode 111 is formed in which the $Ta_2O_5$ film 108 as the gate insulating film material, barrier metal TiN 109 and Al film 110 are laminated.

NINTH EMBODIMENT

Figure 12:
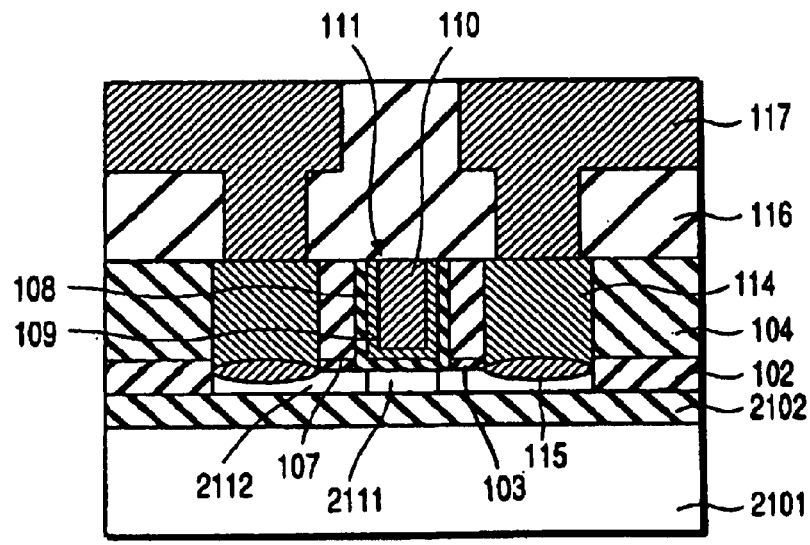
FIG. 12 is a sectional view showing a constitution of nMISFET according to a ninth embodiment.

FIG. 12 is a sectional view showing a constitution of nMISFET according to a ninth embodiment of the present invention. In FIG. 12, the same part as that of FIG. 1 is denoted with the same reference numeral, and the description thereof is omitted. Additionally, FIG. 12 shows the section of the gate length direction.

In the nMISFET, as shown in FIG. 12, an N-type extension region 2112 is formed between the Schottky source/drain 115 and a p-type channel region 2111. Additionally, as the semiconductor substrate, an SOI substrate is used in which a Si support substrate 2101, BOX oxide film 2102 and Si semiconductor layer (channel region 2111, extension region 2112) are laminated.

Since the extension layer 2112 is formed between the Schottky source/drain 115 and the p-type channel region 2111, a height of Schottky barrier is reduced, and a transistor current driving force can be enhanced. Additionally, an impurity concentration of the extension layer has an upper limitation, and is usually about $3\times10^{19} cm^{-3}$. This concentration is a limitation point at which ballistic conduction occurs in a Schottky junctioned portion with ErSi or PtSi used in the source/drain. Moreover, in this structure, the impurity concentration of a conductive type opposite to that of the extension region in the channel region is the same as or more than the impurity concentration of the extension region. Therefore, when the impurity concentration of the extension region is too high, a threshold voltage $V_{th}$ becomes excessively high. Therefore, there may be a need for reduction of the aforementioned concentration depending upon a desired value of the threshold voltage $V_{th}$. Moreover, when the concentration of the extension region or the channel region is too high, pn bond pressure resistance of both the regions disadvantageously drops. This problems sometimes determine the upper limitation of the extension region.

The manufacturing process of the nMISFET shown in FIG. 12 will next be described with reference to FIGS. 13A to 13M.

Figure 13A:
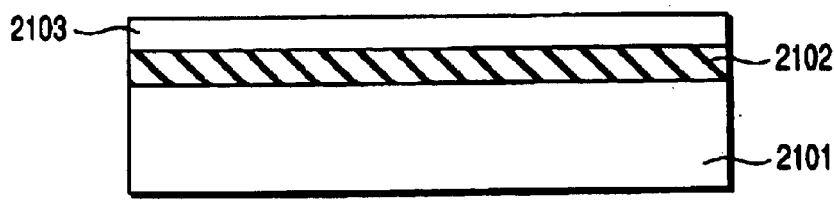
FIGS. 13A to 13M are process sectional views showing a manufacturing process of the nMISFET shown in FIG. 12.

The process will be described in order. First, as shown in FIG. 13A, the semiconductor SOI substrate is prepared in which the Si support substrate 2101, BOX oxide film 2102, and Si semiconductor layer 2103 are laminated.

Figure 13B:
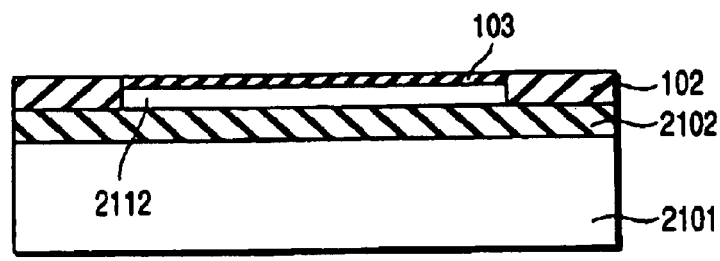

Subsequently, as shown in FIG. 13B, in order to separate the devices using the shallow trench isolation (STI) technique, the Si semiconductor layer 2103 of the device isolating region is removed, and the trench with a depth of about 100 nm is formed. The TEOS film is buried/formed in the trench, and the device isolating insulating film 102 is formed. Moreover, the $SiO_2$ film 103 is formed on the surface of the Si semiconductor layer 2103 by thermal oxidation of about 5 nm. Furthermore, the ion is implanted into the Si semiconductor layer 2103 to form the extension region which forms the source and drain later, and an N-type extension region 2112 is formed. For example, the ion is implanted so that the concentration of As is about $1\times10^{19} cm^{-3}$.

Figure 13C:
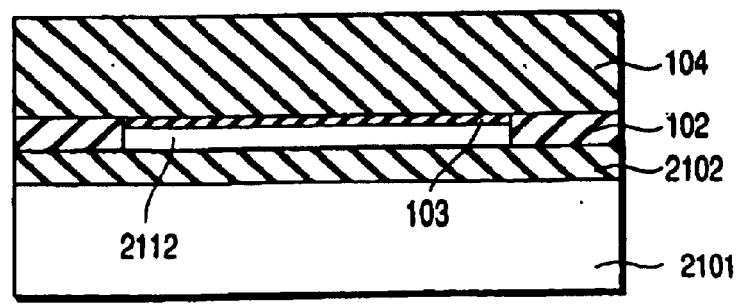

Subsequently, as shown in FIG. 13C, the about 150 nm thick TEOS film is further deposited by the LPCVD method, and the interlayer insulating film 104 is formed. The interlayer insulating film 104 is used later as the stopper of CMP.

Figure 13D:
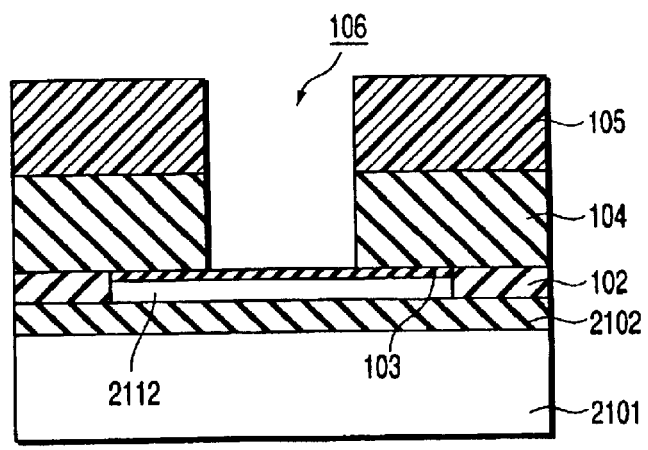

Subsequently, as shown in FIG. 13D, the resist film 105 is formed by the electron beam direct drawing or the lithography, and used as the mask to etch the interlayer insulating film 104 in the gate forming region by the reactive ion etching (RIE) method, and the gate trench 106 is formed.

Figure 13E:
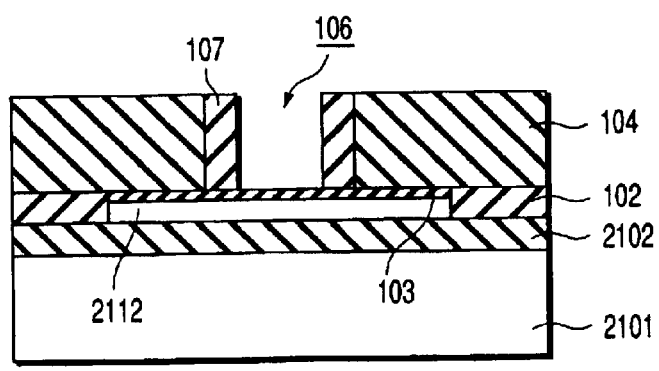

Subsequently, as shown in FIG. 13E, after the resist film 105 is removed, the side wall insulating film 107, for example, of the silicon nitride film is formed inside the gate trench 106.

Figure 13F:
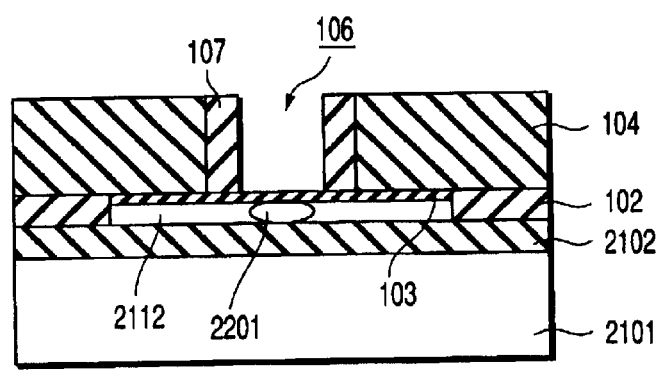
Figure 13G:
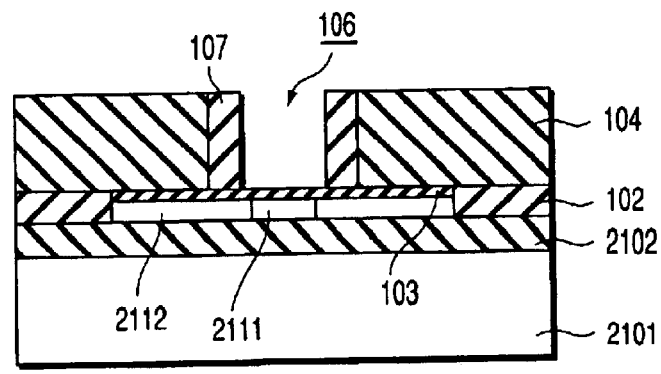

Subsequently, as shown in FIG. 13F, a reverse conductive type ion (boron, and the like) is implanted so as to cancel the n-type extension region 2112 implanted into the whole surface, and a p-type ion implanted region 2201 is formed. For example, the ion with a concentration ($>1\times10^{19} cm^{-3}$) higher than that of the extension region is implanted so that the channel region forms the p-type semiconductor. In the ion injection, the transistor threshold voltage is simultaneously adjusted. Moreover, as shown in FIG. 13G, the p-type ion implanted region 2201 is activated, and the p-type channel region 2111 is formed.

In the transistor of the ninth embodiment, the silicide electrode for Schottky-junction the source/drain electrode to the extension region is to be formed at a low temperature (e.g., 450° C. or less) (a deep bond using the high-concentration impurity is not to be formed), and therefore the 450° C. or higher temperature thermal treatment process does not exist after gate formation. Therefore, the highly dielectric film or the ferroelectric film ($Ta_2O_5$ film, $TiO_2$ film, $Si_3N_4$ film, $(Ba, Sr)TiO_3$, $HfO_2$, $ZrO_2$, $La_2O_3$, $Gd_2O_3$, $Y_2O_3$, $CaF_2$, $CaSn_2$, $CeO_2$, yttria stabilized zirconia, $Al_2O_3$, $ZrSiO_4$, $HfSiO_4$, $Gd_2SiO_5$, $2La_2O_3 \cdot 3SiO_2$, and the like) can be used in the gate insulating film. Moreover, the metal material (TiN, WN, Al, W, Ru, Mo, and the like) can be used in the gate electrode.

If the high-temperature process of about 800 to 1000° C. exists after the gate formation, the metal gate atom is diffused in the gate insulating film to deteriorate the gate breakdown voltage, and the thin film layer having a low permittivity is formed in the interface between the high-k film and silicon. Moreover, the effective gate insulating film thickness remarkably increases, and device property is deteriorated.

In the ninth embodiment, the case will be described in which the $Ta_2O_5$ film is used as the gate insulating film material and the lamination structure of barrier metal TiN and W is used as the metal gate material.

Figure 13H:
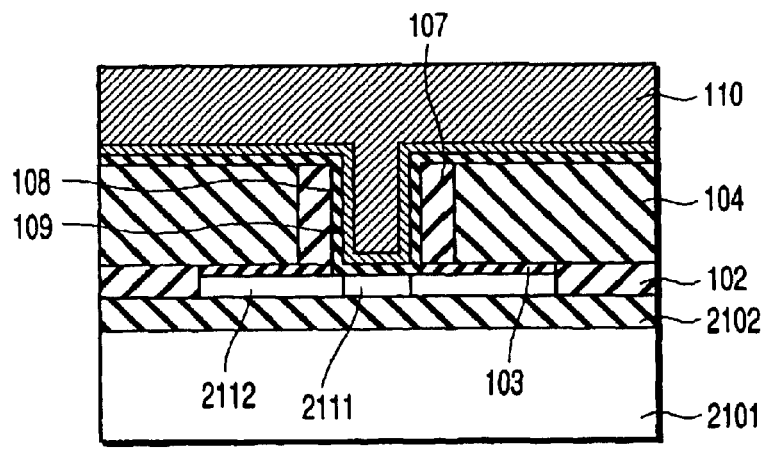

The manufacturing method will be described in detail. As shown in FIG. 13H, for example, the $SiO_2$ film 103 of the bottom portion of the gate trench 106 is removed and the channel region 2111 is exposed. Moreover, a 1 nm or thinner silicon nitride film (NO nitrided oxynitride film) is formed in the bottom portion of the gate trench 106. Furthermore, the $Ta_2O_5$ film 108 is formed by about 4 nm by CVD. In this case, the thickness of the gate insulating film in terms of the oxide film is about 1.5 nm or less. Thereafter, for example, the TiN film 109 with a film thickness of about 5 nm is formed as the barrier metal by CVD, and the W film 110 with a film thickness of about 300 nm is formed.

Figure 13I:
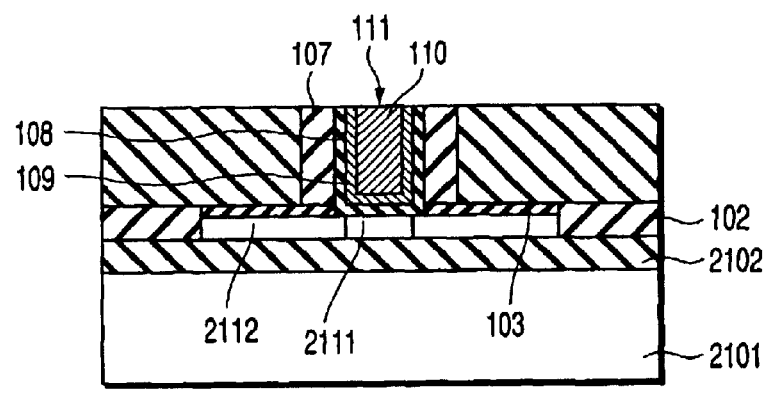

Subsequently, as shown in FIG. 13I, the lamination structure of the TiN film 109 and W film 110 is polished by the CMP method, the TiN film 109 and W film 110 on the TEOS film 104 are patterned by the damascene method, and the metal gate electrode 111 is formed.

Figure 13J:
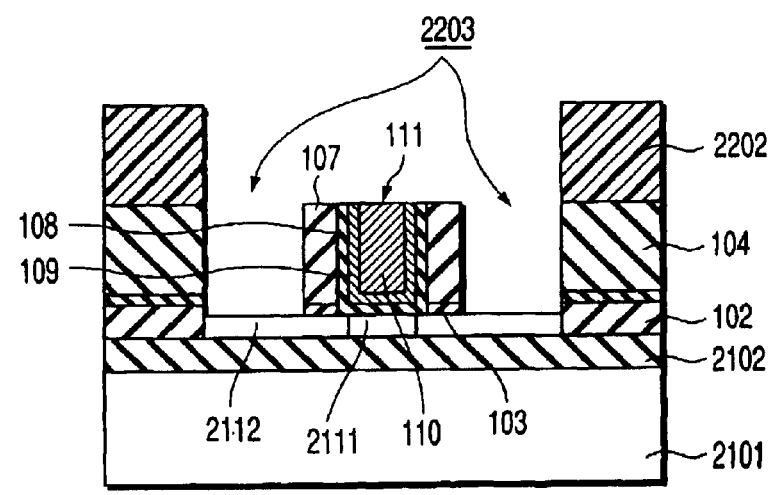

Thereafter, as shown in FIG. 13J, after a resist film 2202 having the opening in the device region is formed by lithography, and the like, the resist film 2202 is used as the mask to selectively etch/remove the interlayer insulating film 104 of the source/drain region, and a source/drain trench 2203 is formed.

Figure 13K:
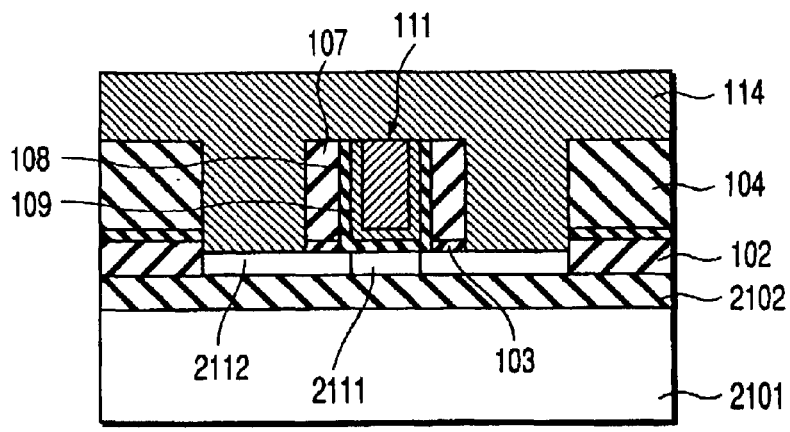
Figure 13L:
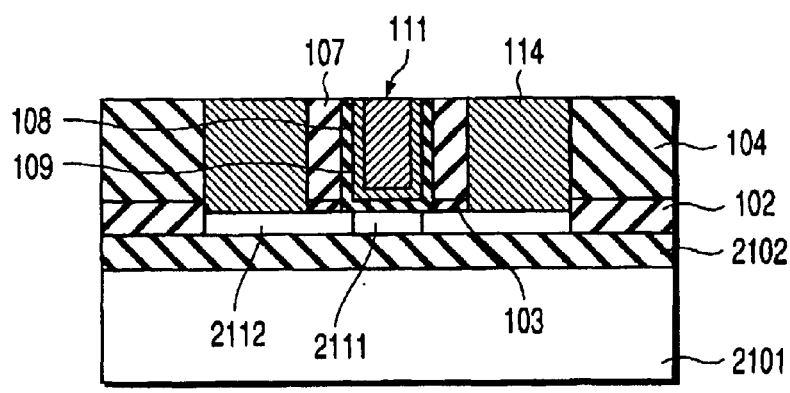
Figure 13M:
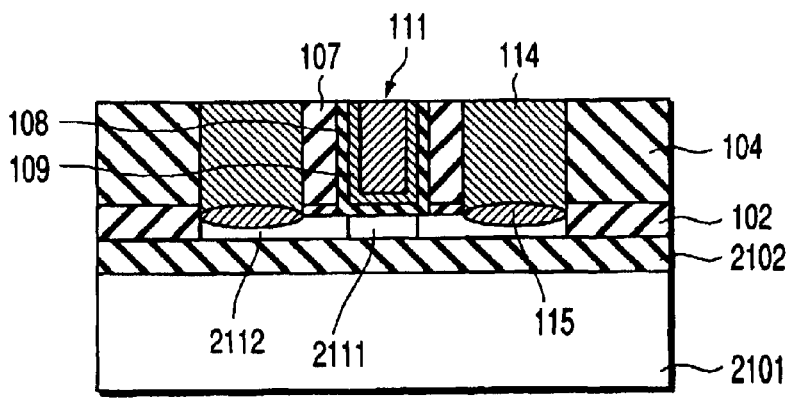

Subsequently, as shown in FIG. 13K, the source/drain electrode 114, for example, of Er is deposited to fill the source/drain trench 2203. Subsequently, as shown in FIG. 13L, the source/drain electrode 114 on the interlayer insulating film 104 is polished by the CMP method, and the source/drain electrode 114 is buried/formed in the source/drain trench 2203. Furthermore, as shown in FIG. 13M, the silicide reaction is caused at a low temperature (e.g., 450° C. or less), the silicide metal ($ErSi_2$) is formed, and the Schottky source/drain 115 is formed.

After forming the source and drain, the process is similar to the usual LSI manufacturing process. That is, the interlayer insulating film TEOS is deposited by the CVD method, the contact hole is made in the source/drain and gate electrodes, and the upper layer metal wiring (e.g., Cu wiring) is formed in the dual damascene method.

In this case, different from the conventional damascene gate, since it is unnecessary to form and remove the dummy gate, the number of steps can remarkably be reduced. Moreover, since it is unnecessary to perform the high-temperature thermal process (usually of about 1000° C.) for activating the source and drain deep diffused layer, the manufacturing is facilitated.

Additionally, the following merit of the damascene gate process continues to exist as it is. That is, [1] since the gate is processed not by RIE but by CMP, the plasma damage is not introduced into the gate insulating film. [2] It is very difficult to process the metal gate on the thin gate insulating film by RIE, but this is unnecessary in the process of the present invention. [3] After the gate is processed, the surface is completely flatted, and the subsequent manufacturing process is facilitated. [4] The source/drain and gate are positioned by self-alignment.

Furthermore, since the Schottky junction is applied to the SOI-MISFET source/drain, contact characteristics can be utilized to compensate for the defect of the SOI device. Additionally, the SOI can be utilized to remove the defect of the Schottky contact. In more detail, [1] the substrate floating problem of SOI-MISFET can be solved by the effect of Schottky barrier both in the source and drain, and [2] since the SOI structure can be used to depress the leak current in the drain contact, the transistor off current (consumption power) can be reduced.

TENTH EMBODIMENT

In a tenth embodiment, the manufacturing method of CMISFET will be described in which the material constituting the Schottky source/drain differs with nMISFET and pMISFET.

The manufacturing method of CMISFET will next be described. FIGS. 14A to 14K are process sectional views showing the manufacturing process of the CMISFET according to the tenth embodiment of the present invention.

Figure 14A:
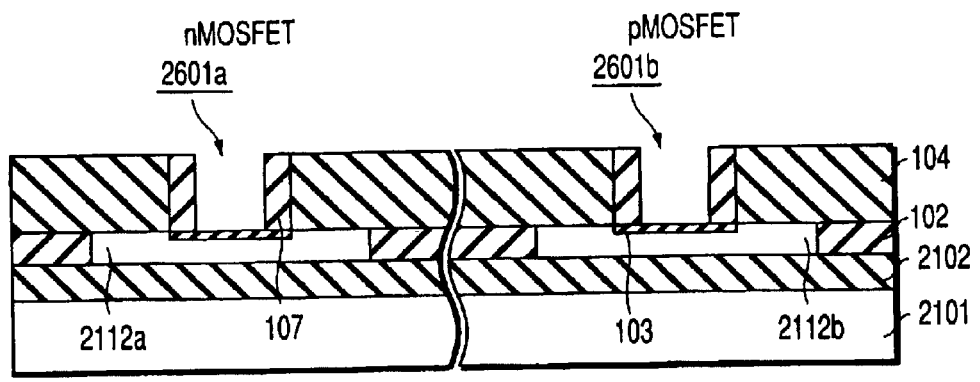
FIGS. 14A to 14K are process sectional views showing a manufacturing process of the CMISFET according to a tenth embodiment.

Since the manufacturing method of FIGS. 13A to 13E is similar to that of the ninth embodiment, the description thereof is omitted. Additionally, n and p-type extension regions 2112a, 2112b are formed in nMIS, pMIS regions, respectively. The subsequent process will be described in order. As shown in FIG. 14A, gate trenches 2601a, 2601b are formed in the interlayer insulating film 104 of the gate forming region, and the side wall insulating film 107, for example, of the silicon nitride film is formed inside the trenches.

Figure 14B:
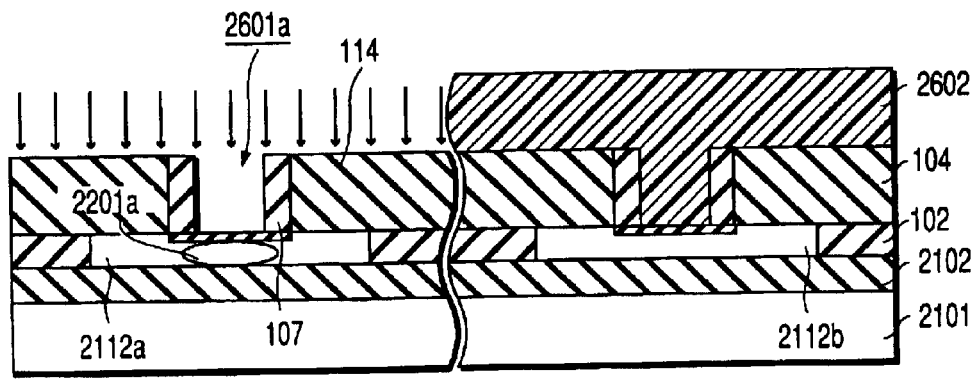

Subsequently, as shown in FIG. 14B, a resist film 2602 is formed which covers the surface of the PMISFET forming region and which has an opening in the nMISFET forming region. Thereafter, the reverse conductive type ion is implanted so as to cancel the impurity introduced in the extension region 2112a, and a p-type ion implanted region 2201a is formed in the extension region 2112a exposed in the bottom portion of the gate trench 2601a. For example, the channel ion with a concentration ($>1 \times 10^{19} cm^{-3}$) higher than that of the n-type extension region 2112a is implanted so that the channel region forms the p-type semiconductor. In the ion injection, the transistor threshold voltage is simultaneously adjusted.

Figure 14C:
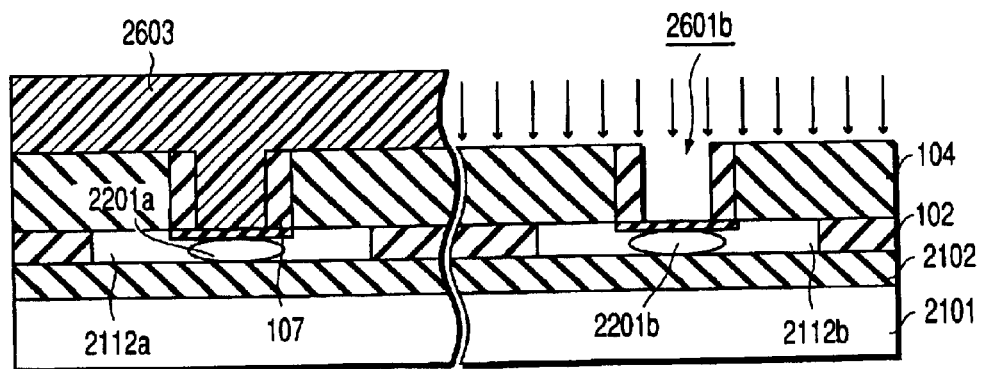

Moreover, as shown in FIG. 14C, after removing the resist film 2602, a resist film 2603 is formed which covers the surface of the nMISFET region and which has an opening in the pMISFET forming region. Thereafter, the reverse conductive type ion is implanted to cancel the impurity introduced in the extension region 2112b, and a n-type ion implanted region 2201b is formed in the extension region 2112b exposed in the bottom portion of the gate trench 2601b. For example, the ion with a concentration ($>1 \times 10^{19} cm^{-3}$) higher than that of the p-type extension region 2112b is implanted so that the channel region forms the n-type semiconductor. In the ion injection, the transistor threshold voltage is simultaneously adjusted.

Figure 14D:
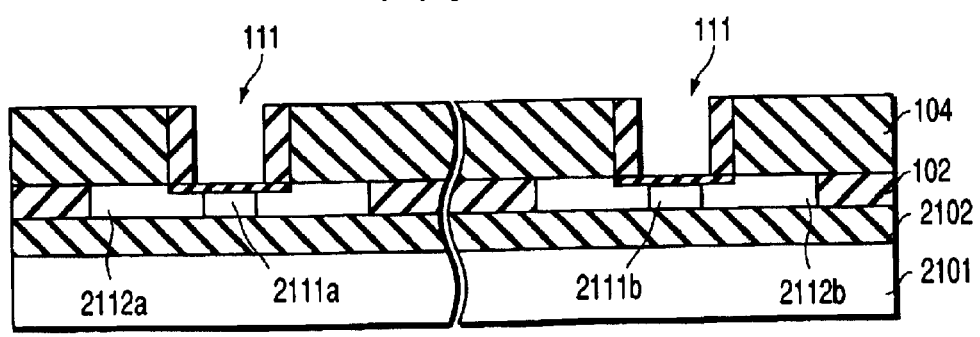

Moreover, as shown in FIG. 14D, after removing the resist film 2603, a thermal treatment for activating the ions implanted in the ion implanted regions 2201a, 2201b is performed, and a P-type channel region 2111a and N-type channel region 2111b are formed.

In the transistor of the present invention, since the source/drain electrode is to be junctioned to the extension regions 2112a, 2112b via silicide (Schottky) and formed at a low temperature (e.g., 450° C. or less) (the deep bond using the high-concentration impurity is not to be formed), the 450° C. or higher temperature thermal treatment process does not exist after gate formation. Therefore, the highly dielectric film or the ferroelectric film ($Ta_2O_5$ film, $TiO_2$ film, $Si_3N_4$ film, $(Ba, Sr)TiO_3$, $HfO_2$, $ZrO_2$, $La_2O_3$, $Gd_2O_3$, $Y_2O_3$, $CaF_2$, $CaSnF_2$, $CeO_2$, yttria stabilized zirconia, $Al_2O_3$, $ZrSiO_4$, $HfSiO_4$, $Gd_2SiO_5$, $2La_2O_3.3SiO_2$, and the like) can be used in the gate insulating film. Moreover, the metal material (TiN, WN, Al, W, Ru, Mo, and the like) can be used in the gate electrode.

Figure 14E:
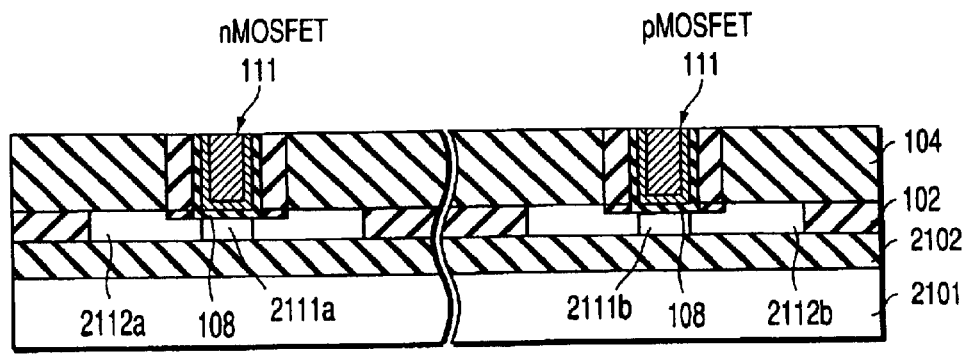

Here, similarly as the ninth embodiment, the $Ta_2O_5$ film is used as the gate insulating film material, and the lamination structure of the barrier metal TiN and W is used as the metal gate material. As shown in FIG. 14E, the metal gate electrode 111 in which the $Ta_2O_5$ film 108, TiN film and W film are laminated is formed in the gate trench.

Figure 14F:
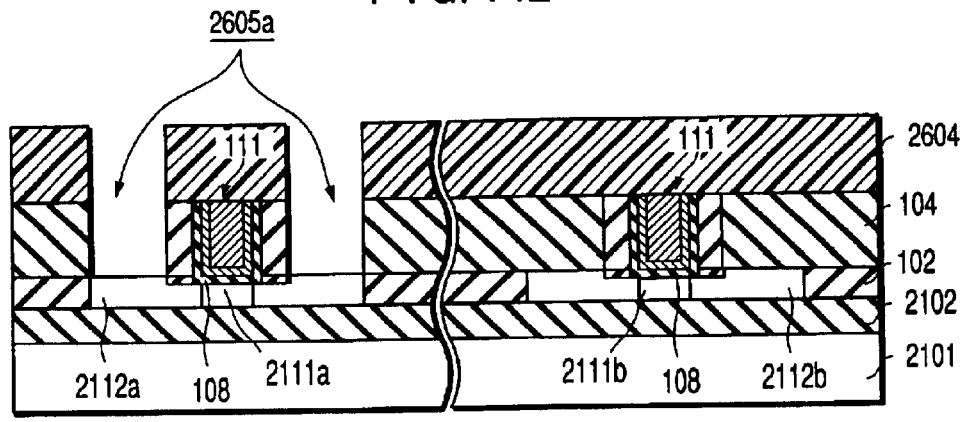
Figure 14G:
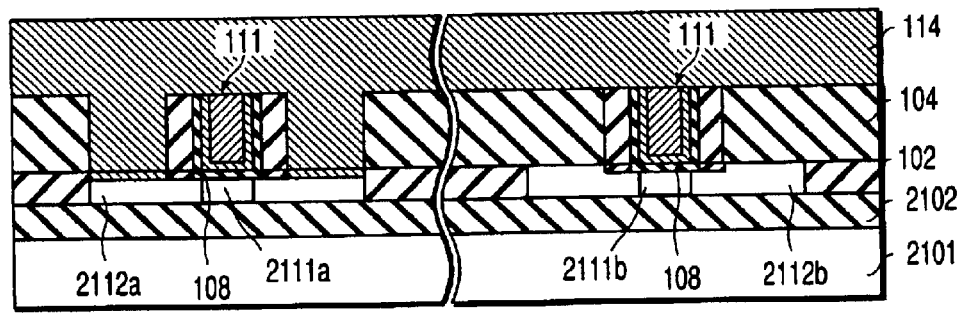
Figure 14H:
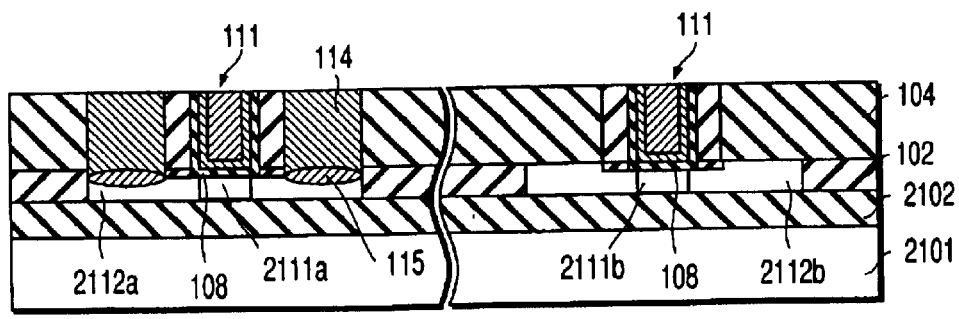

Thereafter, as shown in FIG. 14F, after a resist film 2604 having the opening in the nMIS-side device region is formed by lithography, and the like, the resist film 2202 is used as the mask to selectively etch/remove the interlayer insulating film 104 of the nMIS source/drain region, and nMIS-side source and drain trenches 2605a are formed. Subsequently, as shown in FIG. 14G, the metal material, for example, of the Er film 114 is deposited in the nMIS-side source and drain trenches 2605a. Subsequently, as shown in FIG. 14H, after the Er film 114 is removed from the interlayer insulating film 104, the silicide reaction of the Er film 114 with the extension region 2112a is caused at a low temperature (e.g., 450° C. or less) to form a silicide metal ($ErSi_2$), and the Schottky source/drain 115 is formed.

Figure 14I:
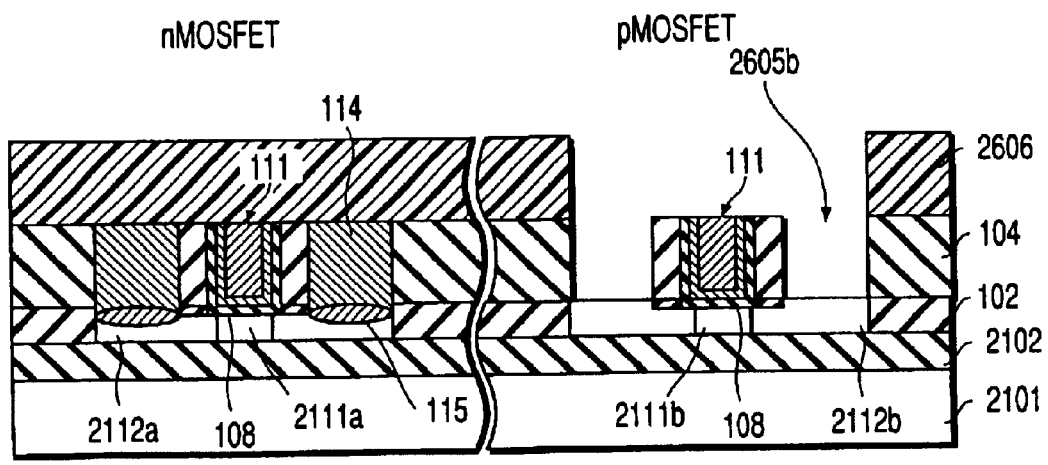
Figure 14J:
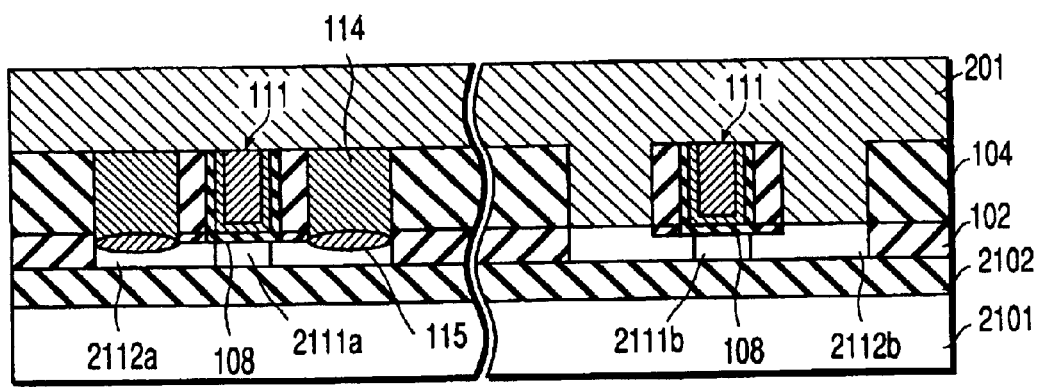
Figure 14K:
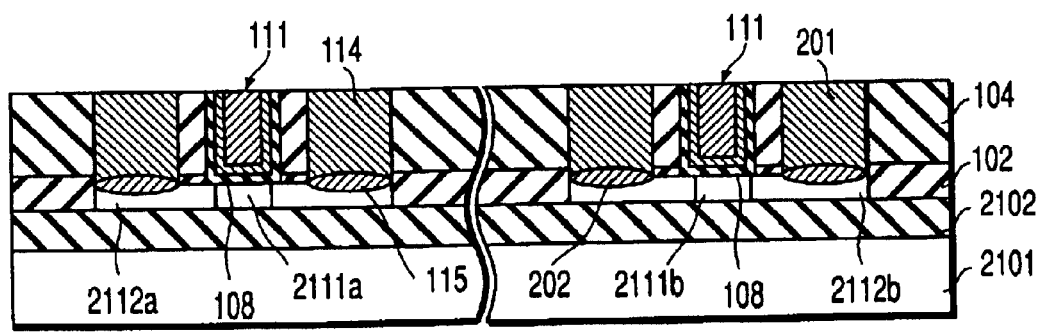

Thereafter, as shown in FIG. 14I, after a resist film 2606 having the opening in the pMIS-side device region is formed by lithography, and the like, the resist film 2202 is used as the mask to selectively etch/remove the interlayer insulating film 104 of the pMIS source/drain region, and pMIS-side source and drain trenches 2605b are formed. Subsequently, as shown in FIG. 14J, the metal material, for example, of the Pt film 201 is deposited in the pMIS-side source and drain trenches 2605b. Subsequently, as shown in FIG. 14K, after the Pt film is removed from the interlayer insulating film 104, the silicide reaction is caused at a low temperature (e.g., 450° C. or less) to form a silicide metal (PtSi), and a Schottky source/drain 202b is formed.

After forming the source and drain, the process is similar to the usual LSI manufacturing process. That is, the interlayer insulating film TEOS is deposited by CVD, the contact hole is made in the source/drain and gate electrodes, and the upper layer metal wiring (e.g., Cu wiring) is formed in the dual damascene method. The sectional views are similar to those of the eighth embodiment, and therefore omitted.

In this case, different from the conventional damascene gate, since it is unnecessary to form and remove the dummy gate, the number of steps can remarkably be reduced. Moreover, since it is unnecessary to perform the high-temperature thermal process (usually of about 1000° C.) for activating the source and drain deep diffused layer, the manufacturing is facilitated.

Furthermore, since different metal materials are used as the source/drain material in nMISFET and PMISFET in the tenth embodiment, the following merit is produced. That is, in the transistor in which Schottky contact (bond) is used in the source and drain, in order to avoid a drop of the current driving ability, the Schottky contact material having a small work function for the N channel, or a large work function for the P channel is required. In the tenth embodiment, erbium silicide ($ErSi_2$) having a small work function can be used in nMISFET, PtSi having a large work function can be used in PMISFET, and the driving current both for nMISFET and pMISFET can be increased. Moreover, when the Schottky contact material is selected, the respective threshold voltages of nMISFET and pMISFET can separately be controlled.

ELEVENTH EMBODIMENT

FIGS. 15A to 15D are process sectional views showing the manufacturing process of the nMISFET according to an eleventh embodiment of the present invention. Additionally, FIGS. 15A to 15D show the sections of the gate length direction.

The characteristics of the eleventh embodiment lie in that not SOI but bulk silicon substrate is used. Since other respects are similar to those of the ninth embodiment, detailed description of the manufacturing method is omitted. According to the eleventh embodiment, the effect (merit) similar to that of the ninth embodiment is obtained excluding the merit attributed to SOI.

Figure 15A:
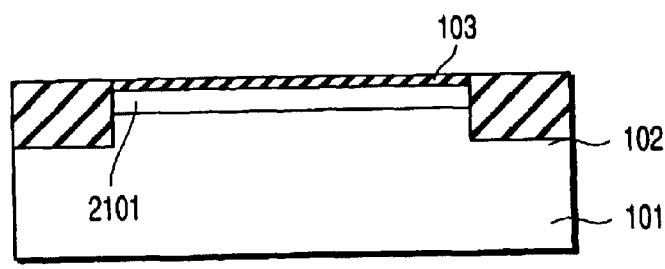
FIGS. 15A to 15D are process sectional views showing a manufacturing process of the nMISFET according to an eleventh embodiment.
Figure 15B:
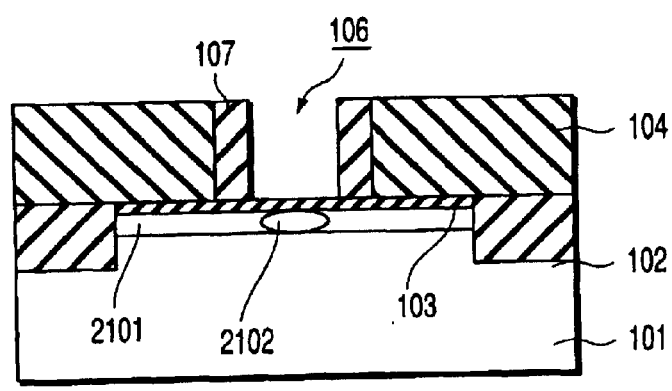
Figure 15C:
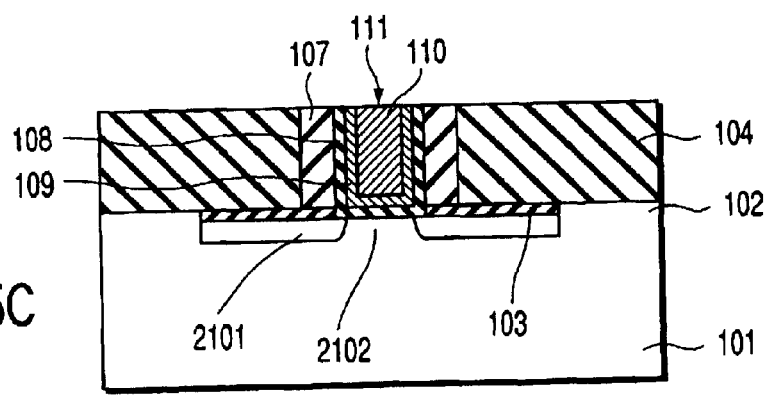
Figure 15D:
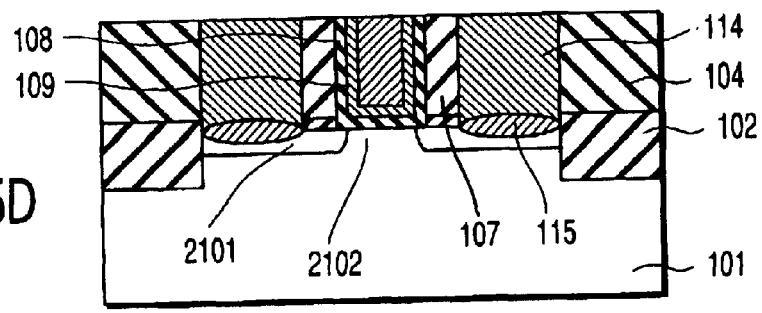

FIG. 15D shows a structure in which the bottom surface of the metal silicide is included in the extension layer 2101. In this case, bond leak can be reduced.

TWELFTH EMBODIMENT

FIGS. 16A to 16I are process sectional views showing the manufacturing process of the nMISFET according to a twelfth embodiment of the present invention. Additionally, FIGS. 16A to 16I show the sections of the gate length direction.

In the twelfth embodiment, a lamination film of an about 10 nm thick silicon nitride film and about 5 nm thick $SiO_2$ film is formed under an interlayer film TEOS.

The process will be described in order. First, as shown in FIG. 16A, the semiconductor SOI substrate is prepared in which the Si support substrate 2101, BOX oxide film 2102, and Si semiconductor layer 2103 are laminated.

Subsequently, as shown in FIG. 16B, in order to separate the devices using the shallow trench isolation (STI) technique, the Si semiconductor layer 2103 of the device isolating region is removed, the trench with a depth of about 100 nm is formed, the TEOS film is buried/formed in the trench, and the device isolating insulating film 102 is formed. Moreover, the $SiO_2$ film 103 is formed on the surface of the Si semiconductor layer 2103 by thermal oxidation of about 5 nm. Furthermore, the ion for forming the extension region is implanted into the Si semiconductor layer 2103 to form the source and drain later, and the N-type extension region 2112 is formed. For example, the ion is implanted so that the concentration of As is about $1 \times 10^{19} cm^{-3}$.

Subsequently, as shown in FIG. 16C, after an about 10 nm thick silicon nitride film 3001 is further deposited on the oxide film, the about 150 nm thick TEOS film 104 is deposited by the LPCVD method.

Subsequently, as shown in FIG. 16D, the resist film 105 is formed by the electron beam direct drawing or the lithography, and used as the mask to etch the interlayer insulating film 104 in the gate forming region by the reactive ion etching (RIE) method, and the gate trench 106 is formed. In this case, the silicon nitride film 301 serves as the etching stopper, and prevents the extension region 2112 from being etched.

Subsequently, as shown in FIG. 16E, after the resist film 105 is removed, the side wall insulating film 107, for example, of the silicon nitride film is formed inside the gate trench 106. Moreover, the reverse conductive type ion (boron, and the like) is implanted so as to cancel the n-type extension region 2112 implanted into the whole surface, the p-type ion implanted region is activated, and the p-type channel region 2111 is formed. In the ion injection, the transistor threshold voltage is simultaneously adjusted.

Subsequently, as shown in FIGS. 16F, 16G, after the $SiO_2$ film 103 on the channel region 2111 is removed by HF, and the like, the damascene method is used to form the $Ta_2O_5$ film 108, TiN film 109 and W film 110 (metal gate electrode 111) in the gate trench 106.

Figure 16H:
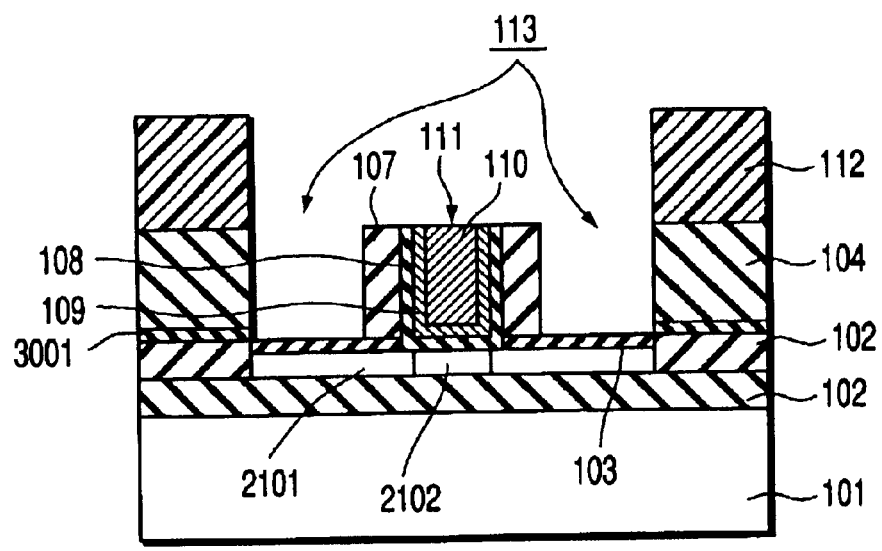
Figure 16I:
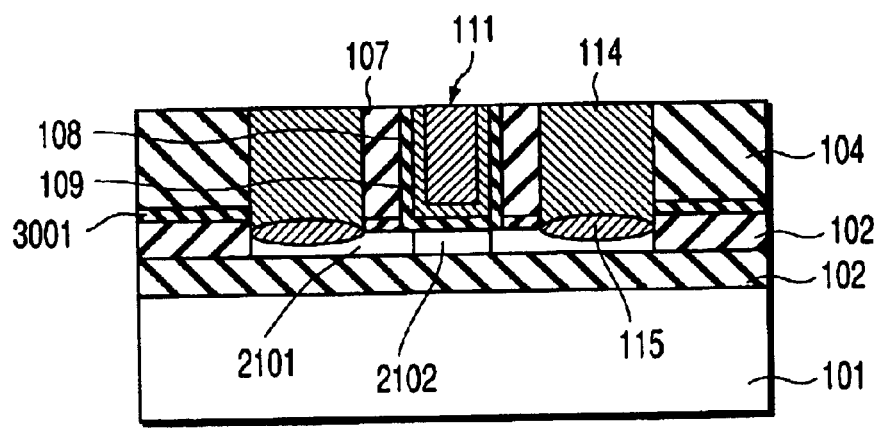

Subsequently, as shown in FIG. 16H, the resist film 112 is used as the mask to form the source/drain trench 113. Moreover, as shown in FIG. 16I, after the resist film 112 is removed, the damascene method is used to form the Er film 114 in the source/drain trench 113. Moreover, the silicide reaction between the Er film 114 and the extension region 2112a is caused at the low temperature (e.g., 450° C. or less) to form the silicide metal ($ErSi_2$), and the Schottky source/drain 115 is formed. According to the twelfth embodiment, the effect (merit) similar to the ninth embodiment can be obtained. Additionally, the following merit is obtained. That is, the lamination film of the about 10 nm thick silicon nitride film and about 5 nm thick $SiO_2$ film is formed under the interlayer film TEOS. Therefore, when the gate forming region TEOS is etched by the reactive ion etching (RIE) method to form the gate trench, the silicon nitride film serves as the RIE stopper, and can prevent the silicon substrate from being etched or damaged by RIE. Therefore, the property of MIS interface is remarkably improved.

Additionally, the present invention is not limited to the aforementioned embodiments. For example, in the aforementioned embodiments, the gate insulating film material is a highly dielectric film, and the gate electrode material is a metal. However, the gate insulating film material may be the highly dielectric film, and the gate electrode material may not be the metal. Moreover, the gate electrode material may be the metal, and the gate insulating film material may not be the highly dielectric film.

Additionally, the present invention can variously be modified and carried out within the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising the steps of:

forming an interlayer insulating film on a silicon substrate;

selectively removing said interlayer insulating film between source and drain forming regions of a MISFET, to forming a gate trench;

forming a side wall insulating film on a side wall of said gate trench;

exposing said silicon substrate on a bottom surface of said gate trench, and forming a gate insulating film on the exposed surface of the silicon substrate;

burying/forming a gate electrode in said trench;

selectively etching said interlayer insulating film of the source and drain forming regions of said MISFET, to forming a source/drain trench with a surface of said silicon substrate exposed in a bottom portion thereof burying/forming a metal film in said source/drain trench, to forming a source electrode and a drain electrode; and forming a source and a drain, composed of a silicide film, to be Schottky junctioned to the silicon substrate, the silicide film being formed by reacting said silicon substrate with said source electrode and the drain electrode.

2. The method for manufacturing the semiconductor device according to claim 1, wherein said gate electrode and said gate insulating film are formed of a metal material and a highly dielectric material, and said silicon substrate is reacted with said metal film at a temperature of 450° or less.

3. A method for manufacturing a semiconductor device comprising the steps of:

forming an interlayer insulating film on a silicon substrate;

selectively removing said interlayer insulating film between source and drain forming regions of a pMISFET and a nMISFET, to forming a gate trench;

forming a side wall insulating film on a side wall of said gate trench;

exposing said silicon substrate on a bottom surface of said gate trench, and forming a gate insulating film on the exposed surface of the silicon substrate;

burying/forming a gate electrode in said gate trench;

removing said interlayer insulating film of the source and drain forming regions of the pMISFET, to forming a pMIS-side source/drain trench with a surface of said silicon substrate exposed in a bottom portion thereof;

burying/forming a first metal film in said pMIS-side source/drain trench, to forming a source electrode and a drain electrode of the pMISFET;

forming a source and a drain of the pMISFET, which composed of a first silicide film, to be Schottky junctioned to the silicon substrate the first silicide film being formed by reacting said silicon substrate with said source electrode and said drain electrode of the pMISFET;

removing said interlayer insulating film between source and drain forming regions of the nMISFET, to forming a nMIS-side source/drain trench with a surface of said silicon substrate exposed in a bottom portion thereof;

burying/forming a second metal film formed of a material different from a material of the first metal film in said nMIS-side source/drain trench, and forming a source electrode and a drain electrode of the nMISFET; and forming a source and a drain of the nMISFET, composed of a second silicide film, to be Schottky junctioned to the silicon substrate, the second silicide film being formed by reacting said silicon substrate with said source electrode and said drain electrode of the nMISFET.

4. The method for manufacturing the semiconductor device according to claim 3,
   wherein said gate electrode and said gate insulating film are formed of a metal material and a highly dielectric material, and
   said silicon substrate is reacted with said first and second metal film at a temperature of 450° or less.

5. A method for manufacturing a semiconductor device comprising the steps of;
   forming an extension region with a first conductive type impurity introduced therein on a surface of a silicon substrate;
   forming an interlayer insulating film on said silicon substrate;
   selectively removing said interlayer insulating film between source and drain forming regions of a MISFET, to forming a gate trench;
   forming a side wall insulating film on a side wall of said gate trench;
   introducing a second conductive type impurity into said extension region of a lower portion of said gate trench, to forming a channel region;
   exposing said silicon substrate on a bottom surface of said gate trench, and forming a gate insulating film on the exposed surface of the silicon substrate;
   burying/forming a gate electrode in said gate trench;
   selectively etching said interlayer insulating film of said source and drain forming regions of said MISFET, to forming a source/drain trench with the surface of said silicon substrate exposed in a bottom portion thereof;
   burying/forming a metal film in said source/drain trench, to forming a source electrode and a drain electrode; and
   forming a source and a drain, composed of a silicide film, to be Schottky junctioned to the silicon substrate, the silicide film is being formed by reacting said silicon substrate with said source electrode and said drain electrode.

6. The method for manufacturing the semiconductor device according to claim 5,
   wherein said gate electrode and said gate insulating film are formed of a metal material and a highly dielectric material, and
   said silicon substrate is reacted with said metal film at a temperature of 450° or less.

7. A method for manufacturing a semiconductor device comprising the steps of:
   forming an interlayer insulating film on a silicon substrate;
   forming a source/drain trench with a surface of said silicon substrate exposed in a bottom portion thereof in said interlayer insulating film of a MISFET source and drain forming regions;
   burying/forming a metal film in said source/drain trench, and forming a source electrode and a drain electrode;
   forming a source and a drain of the nMISFET, composed of a silicide film, to be Schottky junctioned to the silicon substrate, the silicide film is being formed by reacting said silicon substrate with said source electrode and said drain electrode of the nMISFET;
   forming a gate trench having an exposed side surface via which said source electrode is disposed opposite to the drain electrode;
   forming a side wall insulating film in a side wall of said gate trench;
   exposing said silicon substrate on a bottom surface of said gate trench, and forming a gate insulating film on the exposed surface of the silicon substrate; and
   burying/forming a gate electrode in said gate trench.

* * * * *

UNITED STATES PATENT AND TRADEMARK OFFICE
CERTIFICATE OF CORRECTION

PATENT NO. : 6,887,747 B2 Page 1 of 1
DATED : May 3, 2005
INVENTOR(S) : Yagishita et al.

It is certified that error appears in the above-identified patent and that said Letters Patent is hereby corrected as shown below:

Column 20,
Line 9, change "thereof" to -- thereof; --.

Column 21,
Line 9, change "of;" to -- of: --.

Signed and Sealed this

Twelfth Day of July, 2005

JON W. DUDAS
*Director of the United States Patent and Trademark Office*